(12) United States Patent
Wang et al.

(10) Patent No.: US 12,648,108 B2
(45) Date of Patent: Jun. 2, 2026

(54) ELECTRIC CONTROL BOX, AIR CONDITIONER OUTDOOR UNIT, AND AIR CONDITIONER

(71) Applicants:GD MIDEA HEATING & VENTILATING EQUIPMENT CO., LTD., Foshan (CN); HEFEI MIDEA HEATING & VENTILATING EQUIPMENT CO., LTD., Hefei (CN)

(72) Inventors: Guochun Wang, Foshan (CN); Kaiquan Song, Foshan (CN); An Xu, Foshan (CN); Huadong Luo, Foshan (CN); Tingbo Chen, Foshan (CN); Hongwei Li, Foshan (CN)

(73) Assignees: GD MIDEA HEATING & VENTILATING EQUIPMENT CO., LTD., Foshan (CN); HEFEI MIDEA HEATING & VENTILATING EQUIPMENT CO., LTD, Hefei (CN)

( * ) Notice: Subject to any disclaimer, the term of this patent is extended or adjusted under 35 U.S.C. 154(b) by 284 days.

(21) Appl. No.: 18/564,011

(22) PCT Filed: Jul. 26, 2022

(86) PCT No.: PCT/CN2022/108031
§ 371 (c)(1),
(2) Date: Nov. 24, 2023

(87) PCT Pub. No.: WO2023/016252
PCT Pub. Date: Feb. 16, 2023

(65) Prior Publication Data
US 2025/0344340 A1 Nov. 6, 2025

(30) Foreign Application Priority Data

Aug. 7, 2021 (CN) .......................... 202110904558.2
Aug. 7, 2021 (CN) .......................... 202121839197.X
Aug. 7, 2021 (CN) .......................... 202121839215.4

(51) Int. Cl.
*H05K 7/20* (2006.01)
(52) U.S. Cl.
CPC ..... *H05K 7/20145* (2013.01); *H05K 7/20154* (2013.01); *H05K 7/20172* (2013.01)
(58) Field of Classification Search
CPC ...... F24F 1/24; F24F 1/22; F24F 11/89; F24F 13/20; F24F 13/30; F24F 1/0018;
(Continued)

(56) References Cited

U.S. PATENT DOCUMENTS

| | | | | |
|---|---|---|---|---|
| 5,369,813 A | * | 12/1994 | Goddard | ................. E03D 9/052 4/213 |
| 7,312,992 B2 | * | 12/2007 | Jory | .......................... G06F 1/20 361/695 |

(Continued)

FOREIGN PATENT DOCUMENTS

| | | |
|---|---|---|
| CN | 103363597 A | 10/2013 |
| CN | 104704935 A | 6/2015 |

(Continued)

OTHER PUBLICATIONS

IP Australia Examination report No. 1 for Application No. 2022326662 Nov. 1, 2024 5 pages.
(Continued)

*Primary Examiner* — Michael A Matey
(74) *Attorney, Agent, or Firm* — Anova Law Group, PLLC

(57) ABSTRACT

An electric control box includes a box body and a mounting plate arranged in the box body. The mounting plate is provided with a fan and a plurality of electronic components at a mounting side of the mounting plate. The fan is configured to form first heat dissipation airflow flowing
(Continued)

along a first heat dissipation path. The first heat dissipation airflow is diverted by an inner wall of the box body to form second heat dissipation airflow flowing along a second heat dissipation path. The first heat dissipation path and the second heat dissipation path are located at the mounting side of the mounting plate. The plurality of electronic components are distributed over the first heat dissipation path and the second heat dissipation path.

20 Claims, 17 Drawing Sheets

(58) Field of Classification Search
CPC .... F24F 1/0325; F24F 1/10; F24F 1/38; F24F
2013/205; H05K 7/20145; H05K
7/20136; H05K 7/20154; H05K 7/20172;
H05K 7/202; H05K 7/20909; H05K
7/20209; H05K 7/2039; H05K 7/20918;
H05K 5/0213; H05K 5/0217; H05K 7/20;
H05K 7/20509; H05K 7/14; H05K
7/20963; G06F 1/183; G06F 1/206; G06F
1/181; F28D 2021/0029; F28F 9/0243;
F28F 9/02; G02F 1/133385; G02F
1/133628; B60H 1/00521; B60H 1/00042;
F25D 17/06; F25D 2317/0682; F25D
2317/0684; H02M 7/003
See application file for complete search history.

(56) References Cited

U.S. PATENT DOCUMENTS

| | | | | |
|---|---|---|---|---|
| 8,749,749 | B2* | 6/2014 | Hubbard | G02F 1/133308 349/161 |
| 2006/0114652 | A1* | 6/2006 | Jory | H05K 7/20727 361/694 |
| 2007/0190926 | A1* | 8/2007 | Lu | H05K 7/20145 454/316 |
| 2008/0151501 | A1* | 6/2008 | Takasou | H05K 7/20154 361/697 |
| 2008/0266792 | A1* | 10/2008 | Li | H05K 7/20909 361/695 |
| 2009/0195983 | A1* | 8/2009 | Reichert | G06F 1/203 361/695 |
| 2010/0039771 | A1* | 2/2010 | Marchand | H05K 7/20909 361/694 |
| 2010/0321887 | A1* | 12/2010 | Kwon | H05K 7/20972 361/695 |
| 2011/0108250 | A1* | 5/2011 | Hong | H05K 7/20163 165/121 |
| 2013/0170138 | A1* | 7/2013 | Fujii | H05K 7/20136 361/695 |
| 2015/0017905 | A1* | 1/2015 | Li | H04B 1/3888 454/184 |
| 2015/0216077 | A1* | 7/2015 | Tanaka | H05K 7/20145 361/689 |
| 2015/0245537 | A1* | 8/2015 | Sakuma | H05K 7/20918 363/141 |
| 2016/0174411 | A1* | 6/2016 | Lee | H05K 7/20254 165/80.5 |
| 2018/0095508 | A1* | 4/2018 | Yi | H05K 7/20163 |
| 2018/0216836 | A1 | 8/2018 | Hashimoto et al. | |
| 2019/0186772 | A1* | 6/2019 | Zhong | F24F 1/32 |
| 2019/0186773 | A1* | 6/2019 | Zhong | F25B 29/00 |

FOREIGN PATENT DOCUMENTS

| | | | |
|---|---|---|---|
| CN | 107726474 | A | 2/2018 |
| CN | 107726475 | A | 2/2018 |
| CN | 109959081 | A | 7/2019 |
| CN | 209181132 | U | 7/2019 |
| CN | 209558628 | U | 10/2019 |
| CN | 210008155 | U | 1/2020 |
| CN | 210808085 | U | 6/2020 |
| CN | 111386005 | A | 7/2020 |
| CN | 111447806 | A | 7/2020 |
| CN | 212777670 | U | 3/2021 |
| CN | 215412220 | U | 1/2022 |
| CN | 215412223 | U | 1/2022 |
| DE | 102008062430 | A1 | 7/2010 |
| JP | H05118671 | A | 5/1993 |
| JP | 2002022209 | A | 1/2002 |
| JP | 201311392 | A | 1/2013 |
| JP | 5148527 | B2 | 2/2013 |
| JP | 2014040951 | A | 3/2014 |
| JP | 2017090009 | A | 5/2017 |
| JP | 2018004099 | A | 1/2018 |
| JP | 2018179355 | A | 11/2018 |
| JP | 2020099978 | A | 7/2020 |
| JP | 2021139578 | A | 9/2021 |
| WO | 2014147961 | A1 | 9/2014 |
| WO | 2019114311 | A1 | 6/2019 |

OTHER PUBLICATIONS

The European Patent Office (EPO) The Extended European Search Report for Application No. 22855235.2 Nov. 6, 2024 9 Pages.

The Japan Patent Office (JPO) Notice of Reasons for Refusal for Application No. 2023-572943 Jan. 7, 2025 16 Pages (including translation).

The World Intellectual Property Organization (WIPO) The Written Opinion for PCT/CN2022/108031 Sep. 28, 2022 9 pages (including English translation).

Brazilian Patent and Trademark Office (INPI) The Search Report for BR Application No. 112023023169-8 Apr. 16, 2024 8 Pages (Translation Included).

The World Intellectual Property Organization (WIPO) International Search Report for PCT/CN2022/108031 Sep. 28, 2022 7 pages (including English translation).

The Australian National Intellectual Property Office Examination report No. 2 for Application No. 2022326662 Apr. 19, 2025 4 pages.

Canadian Intellectual Property Office The Office Action For CA Application No. 3129926 Mar. 3, 2025 3 Pages.

China National Intellectual Property Administration (CNIPA) Office Action 1 for 202110904558.2 May 13, 2025 12 Pages(including translation).

The Australian National Intellectual Property Office The Notice of acceptance for Application No. 2022326662 Sep. 1, 2025 4 pages.

The European Patent Office (EPO) The Intention to grant for EP Application No. 22855235.2-1015 Jun. 12, 2025 9 Pages.

Japan Patent Office (JPO) The Decision to Grant a Patent For JP Application No. 2023-572943 Jun. 24, 2025 6 Pages (Translation Included ).

Korean Intellectual Property Office (KIPO) The Office Action For KR Application No. 10-2023-7039781 Jun. 13, 2025 15 Pages (Translation Included ).

Korean Intellectual Property Office (KIPO) The Office Action For KR Application No. 10-2023-7039781 Jan. 29, 2026 15 Pages (Translation Included ).

The China National Intellectual Property Administration (CNIPA) The Second Office Action for Chinese Application 202110904558.2 Jan. 6, 2026 14 Pages (With Translation).

* cited by examiner 1542     1541     1541     1542

154

A

700

730

710

720

1

ELECTRIC CONTROL BOX, AIR CONDITIONER OUTDOOR UNIT, AND AIR CONDITIONER

CROSS-REFERENCE TO RELATED APPLICATIONS

This application is a National Stage Entry under 35 U.S.C. § 371 of International Application No. PCT/CN2022/108031, filed on Jul. 26, 2022, and claims priority to Chinese patent application Ser. No. 20/211,0904558.2, entitled "ELECTRIC CONTROL BOX, AIR CONDITIONER OUTDOOR UNIT, AND AIR CONDITIONER," filed with China National Intellectual Property Administration on Aug. 7, 2021, Chinese Patent Application No. 202121839215.4, entitled "ELECTRIC CONTROL BOX, AIR CONDITIONER OUTDOOR UNIT, AND AIR CONDITIONER," filed with China National Intellectual Property Administration on Aug. 7, 2021, and Chinese Patent Application No. 202121839197.X, entitled "ELECTRIC CONTROL BOX, AIR CONDITIONER OUTDOOR UNIT, AND AIR CONDITIONER," filed with China National Intellectual Property Administration on Aug. 7, 2021, the entire contents of which are incorporated herein by reference.

FIELD

The present disclosure relates to air conditioning technologies, and more particularly, to an electric control box, an air conditioner outdoor unit, and an air conditioner.

BACKGROUND

An air conditioner is a device that artificially adjusts and controls a temperature, humidity, a flow rate and other parameters of an ambient air in a building or a structure. An air conditioner typically includes an electric control box, which is provided with electronic components such as a filter and a reactor. However, heat generated during operation of the electronic components can cause a temperature of the electronic components to rise, which affects operational stability of the electronic components.

SUMMARY

A primary object of the present disclosure is to provide an electronic control box, an air conditioner outdoor unit, and an air conditioner, capable of improving operational reliability of electronic components.

To achieve the above object, the present disclosure discloses an electronic control box. The electric control box includes a box body; and a mounting plate arranged in the box body. The mounting plate is provided with a first fan and a plurality of electronic components at a mounting side of the mounting plate. The first fan is configured to form first heat dissipation airflow flowing along a first heat dissipation path. The first heat dissipation airflow is diverted by an inner wall of the box body to form second heat dissipation airflow flowing along a second heat dissipation path. The plurality of electronic components are distributed over the first heat dissipation path and the second heat dissipation path. The first heat dissipation path and the second heat dissipation path are located at the mounting side of the mounting plate.

Beneficial effect of the present disclosure is that: the first fan is provided to form the first heat dissipation airflow flowing along the first heat dissipation path, and the first heat dissipation airflow is formed into the second heat dissipation airflow flowing along the second heat dissipation path after being diverted by the inner wall of the box body; and the plurality of electronic components is distributed over the first heat dissipation path and second heat dissipation path, and therefore heat generated during operation of the electronic components can be carried away by the first and second heat dissipation airflows. In this way, a temperature during the operation of the electronic components remains within a reliable range, and the electronic component thus has high operational stability.

Based on the above-mentioned technical solutions, the present disclosure can also include the following improvements.

Further, the first heat dissipation path and the second heat dissipation path are connected end to end sequentially to form a circulation heat dissipation path.

Further, the mounting plate divides a space in the box body into a first chamber and a second chamber. The plurality of electronic components is arranged in the first chamber, and the second chamber is internally provided with a heat exchanger.

Further, the mounting plate has a first air return inlet and a second air return inlet that penetrate the mounting plate. The first air return inlet is located at a head end of the first heat dissipation path, and the second air return inlet is located at a tail end of the second heat dissipation path.

Further, the first fan has an inlet in communication with the first air return inlet and an outlet facing towards the head end of the first heat dissipation path.

Further, the mounting plate is a rectangular-shaped plate. The first air return inlet is located at a first corner of the rectangular-shaped plate; the second air return inlet is located at a second corner of the rectangular-shaped plate; and the second corner and the first corner are located at two ends of a same diagonal of the rectangular-shaped plate, respectively.

Further, a plurality of second air return inlets is provided and arranged at intervals along a second side of the mounting plate; and the first air return inlet is arranged at a first side of the mounting plate. The first side is opposite to the second side.

Further, the electric control box further includes a second fan arranged on the first heat dissipation path or the second heat dissipation path.

Further, the second fan is arranged at a head end of the second heat dissipation path.

Further, the second fan is arranged at a tail end of the second heat dissipation path; the first fan has an air outlet direction that does not intersect an air outlet direction of the second fan; and the second fan is configured to form third heat dissipation airflow flowing along a third heat dissipation path.

Further, the plurality of electronic components arranged at the mounting side of the mounting plate comprises a filter and a reactor. The filter and the reactor are distributed on the first heat dissipation path.

Further, the box body is a sealed box body.

The present disclosure further provides an air conditioner outdoor unit. The air conditioner outdoor unit includes the electric control box of any one of the above-mentioned technical solutions.

The present disclosure further provides an air conditioner. The air conditioner includes the air conditioner outdoor unit of any one of the above-mentioned technical solutions.

DETAILED DESCRIPTION OF THE EMBODIMENTS

In the related art, an electronic component is provided inside an electric control box. For example, the electronic component may be a filter, a reactor, etc. The electronic component generates heat when in use, which causes a high temperature of the electronic component, and thus reduces operation reliability of the electrical component. Therefore, it is necessary to cool down the electronic component.

In view of this, an electronic control box of embodiments of the present disclosure is provided with a first fan configured to form first heat dissipation airflow. The first heat dissipation airflow is diverted to form second heat dissipation airflow after the first heat dissipation airflow encounters obstruction of the box body. The first heat dissipation airflow and the second heat dissipation airflow are used to carry away heat of the electronic component, and therefore the electronic component is cooled down to enable high operation reliability of the electronic component.

Technical solutions according to embodiments of the present disclosure will be described clearly and completely below with reference to the accompanying drawings of the embodiments of the present disclosure. Obviously, the embodiments described below are only a part of the embodiments of the present disclosure, rather than all embodiments of the present disclosure. On a basis of the embodiments of the present disclosure, all other embodiments obtained by those skilled in the art without creative labor shall fall within the protection scope of the present disclosure.

The electric control box of the embodiments of the present disclosure may be, for example, a closed electric control box. In this way, damage to the electronic component in the electric control box caused by other foreign matters such as water drops and dust entering the electric control box can be avoided to achieve an effect of waterproof, dust prevention and anti-corrosion.

Referring to FIG. 1, FIG. 2, FIG. 3 and FIG. 4, embodiments of the present disclosure provide an electric control box. The electric control box includes a box body 100, a mounting plate 200, a first fan 300 and an electronic component 400. The mounting plate 200 and the first fan 300 are arranged inside the box body 100, and the box body 100 is configured to protect the mounting plate 200 and the first fan 300. The mounting plate 200 is configured for a mounting of the first fan 300 and the electronic component 400. The first fan 300 is configured to drive air in the box body 100 to flow and form first heat dissipation airflow.

Figure 1:
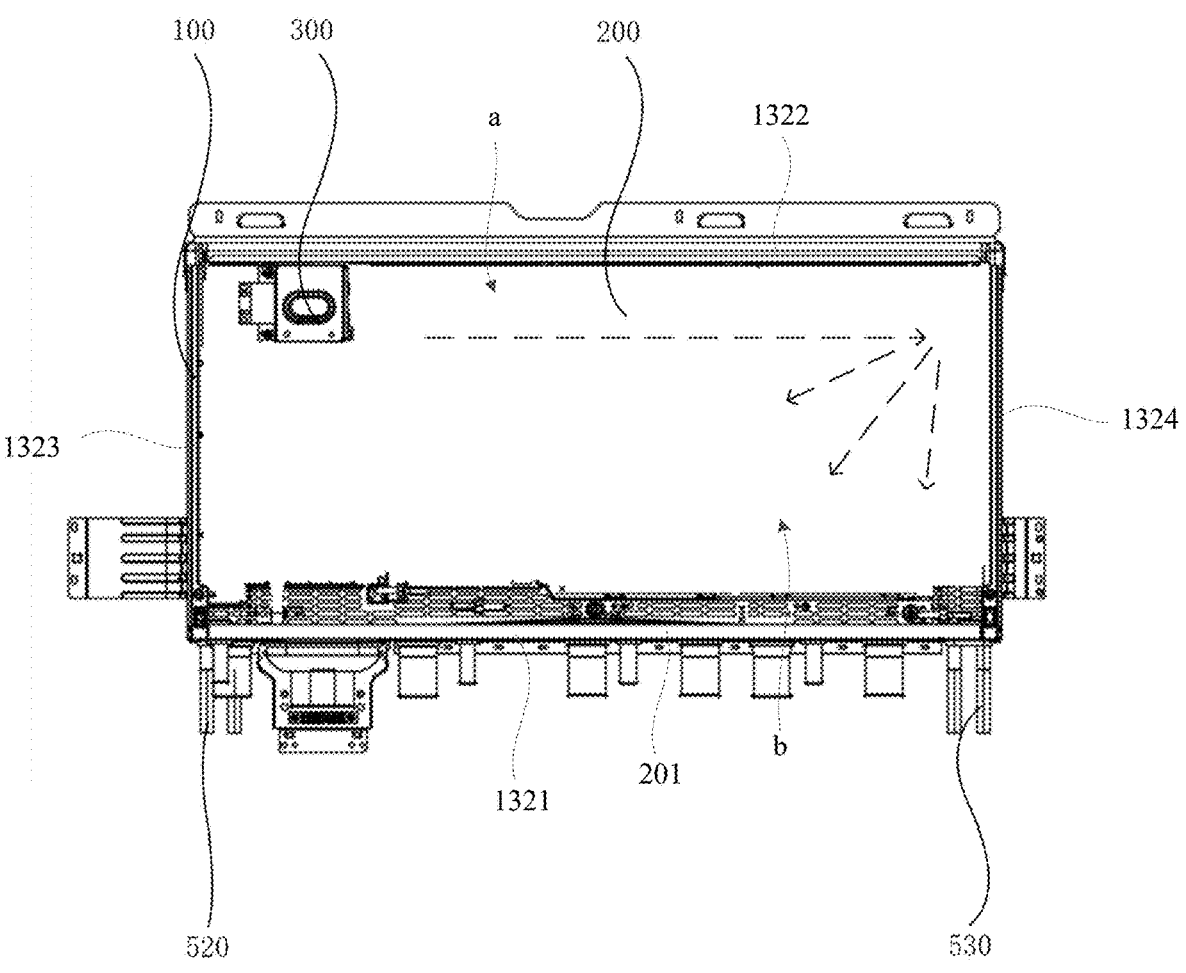
FIG. 1 is a schematic structural view 1 of an electric control box according to an embodiment of the present disclosure.

Referring to FIG. 1, the first heat dissipation airflow formed by the first fan 300 flows along a first heat dissipation path a, and after the first heat dissipation airflow flows to an inner wall of the box body 100, the first heat dissipation airflow is diverted and formed into second heat dissipation airflow flowing along a second heat dissipation path b. An angle between the first heat dissipation path a and the second heat dissipation path b may be any non-zero angle, such as 60° illustrated in FIG. 1.

The electronic component 400 is arranged at a mounting side of the mounting plate 200. In some embodiments, the electronic component 400 may be mounted at the mounting side of the mounting plate 200 through threading. In some other embodiments, the electronic component 400 may be mounted at the mounting side of the mounting plate 200 through welding.

A plurality of electronic components 400 is provided and arranged on the first heat dissipation path a and the second heat dissipation path b. The first heat dissipation airflow flowing along the first heat dissipation path a takes away heat generated during operation of the electronic component 400 arranged on the first heat dissipation path a, and therefore the electronic component 400 arranged on the first heat dissipation path a is cooled down. The second heat dissipation airflow flowing along the second heat dissipation path b takes away heat generated during operation of the electronic component 400 arranged on the second heat dissipation path b, and therefore the electronic component 400 arranged on the second heat dissipation path b is cooled down.

In the electric control box of the embodiments of the present disclosure, the first fan 300 is provided, and the first fan 300 configured to form the first heat dissipation airflow flowing along the first heat dissipation path a. After the first heat dissipation airflow flows to the inner wall of the box body 100, a flowing direction of the first heat dissipation airflow changes and the first heat dissipation airflow is diverted to form the second heat dissipation airflow flowing along the second heat dissipation path b. The heat generated during the operation of the electronic components 400 arranged on the first heat dissipation path a and the second heat dissipation path b is taken away by the first heat dissipation airflow and the second heat dissipation airflow, and therefore a temperature of the electronic component 400 remains within a reliable temperature range. In this way, operational reliability of the electronic component 400 is improved.

In some embodiments, the first heat dissipation path a and the second heat dissipation path b are connected end to end sequentially to form a circulation heat dissipation path. The circulating heat dissipation path is located in the box body 100. A tail end of the first heat dissipation airflow flowing along the circulation heat dissipation path is connected to a head end of the second heat dissipation airflow, and a head end of the first heat dissipation path a flowing along the circulation heat dissipation path is connected to a tail end of the second heat dissipation airflow. Circulation airflow is formed by the first heat dissipation airflow and the second heat dissipation airflow and located in the box body 100. In this case, both the first heat dissipation airflow and the second heat dissipation airflow exchange heat with the electronic component 400 and the box body 100. Therefore, the heat generated during the operation of the electronic component 400 is exchanged to an outer side of the box body 100. In some embodiments, the first heat dissipation path a and the second heat dissipation path b may also not be formed into a circulation path. In these embodiments, the first heat dissipation airflow and the second heat dissipation airflow may also not be formed into circulation airflow.

Figure 4:
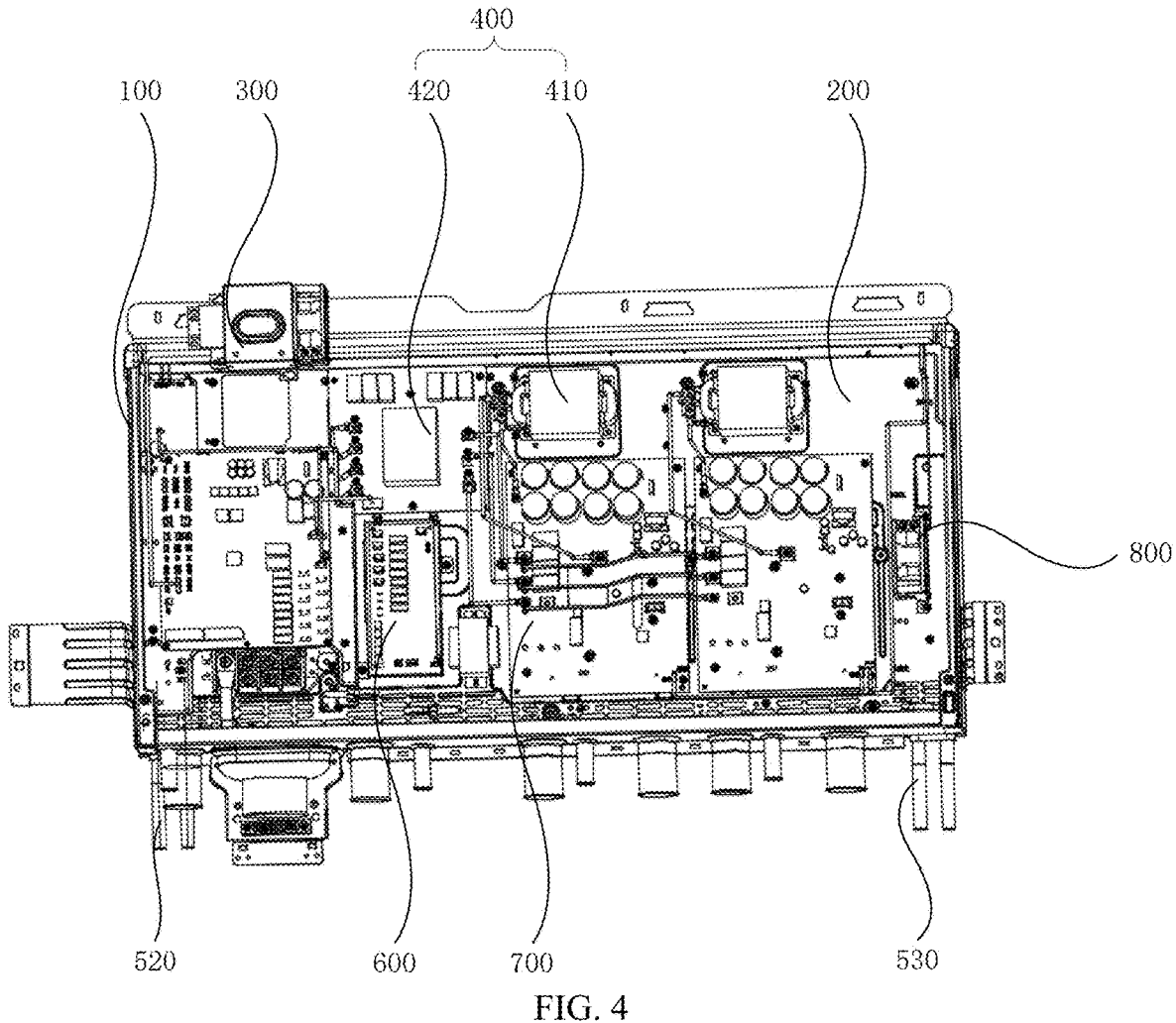
FIG. 4 is a schematic structural view 4 of an electric control box according to an embodiment of the present disclosure.
Figure 5:
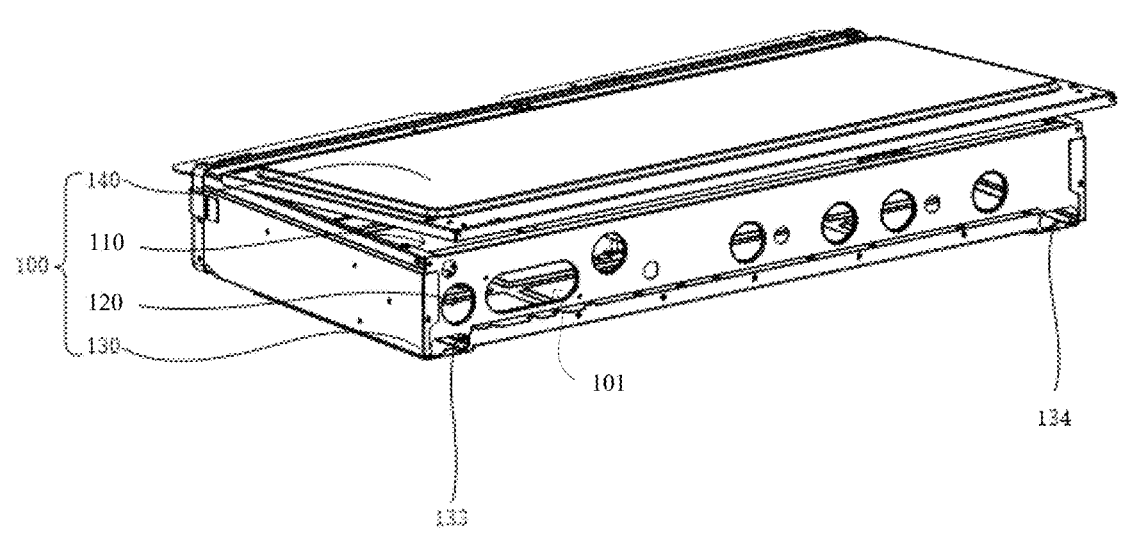
FIG. 5 is a schematic structural view 5 of an electric control box according to an embodiment of the present disclosure.
Figure 6:
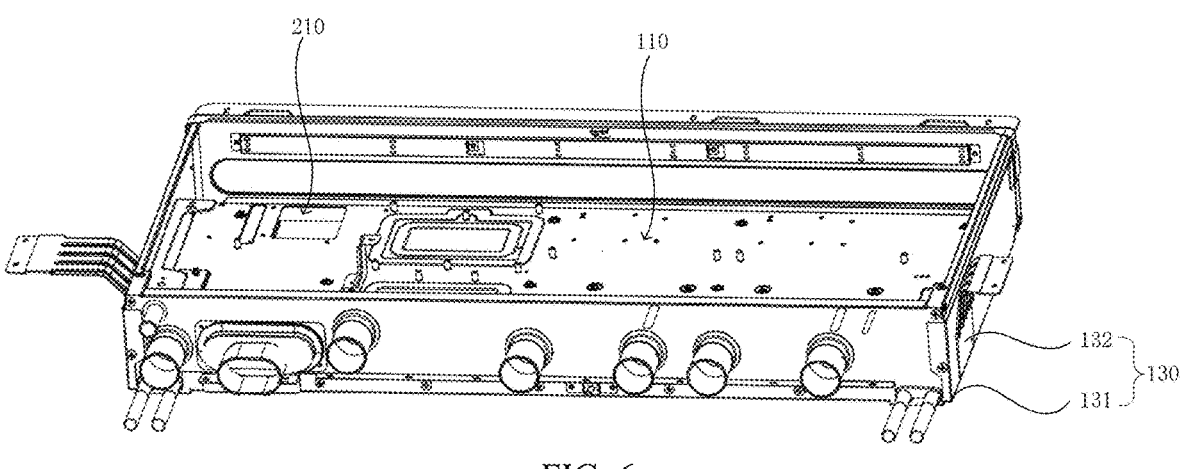
FIG. 6 is a schematic structural view 6 of an electric control box according to an embodiment of the present disclosure.

Referring to FIG. 4, FIG. 5 and FIG. 6, the mounting plate 200 divides a space in the box body 100 into a first chamber 110 and a second chamber 120. The plurality of electronic components 400 is arranged in the first chamber 110. The first heat dissipation airflow and the second heat dissipation airflow are located in the first chamber 110. The second chamber 120 is internally provided with a heat exchanger 500.

Figure 7:
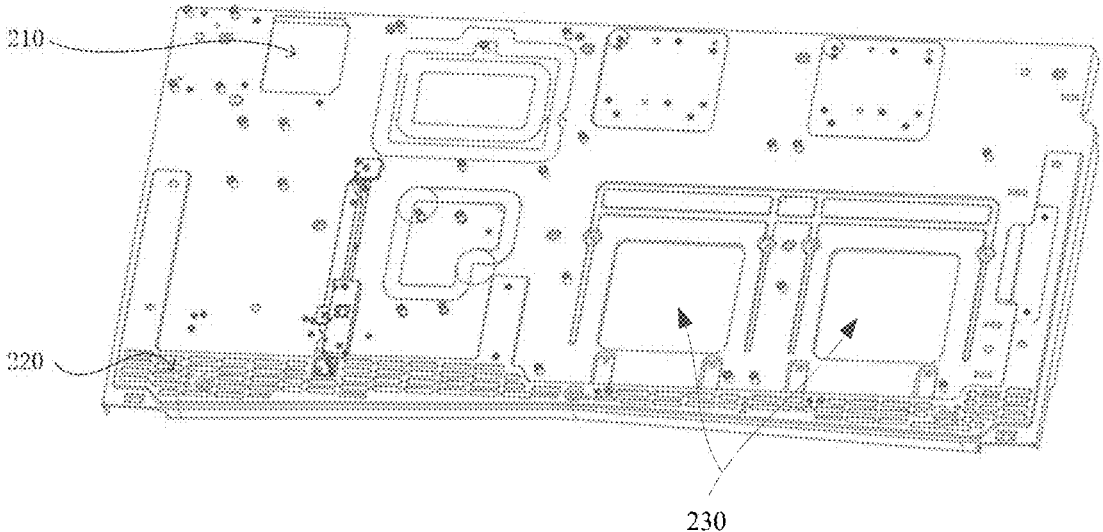
FIG. 7 is a schematic structural view of a mounting plate according to an embodiment of the present disclosure.

Referring to FIG. 4 and FIG. 7, the mounting plate 200 has a first air return inlet 210 and a second air return inlet 220. A shape and a size of the first air return inlet 210 are not limited specifically. The first air return inlet 210 is a through hole, and two ends of the first air return inlet 210 are in communication with the first chamber 110 and the second chamber 120, respectively. A shape and a size of the second air return inlet 220 are not limited specifically. The second air return inlet 220 is a through hole, and two ends of the second air return inlet 220 are in communication with the first chamber 110 and the second chamber 120, respectively. The first air return inlet 210 is located at a head end of the first heat dissipation path a, and the second air return inlet 220 is located at a tail end of the second heat dissipation path b.

During operation of the first fan 300, the first fan 300 drives air in the second chamber 120 into the first chamber 110 through the first air return inlet 210, and the first heat dissipation airflow flowing along the first heat dissipation path a is formed. The first heat dissipation airflow is diverted by the inner wall of the box body to form the second heat dissipation airflow flowing along the second heat dissipation path b, and the second heat dissipation airflow enters the first chamber 110 through the second air return inlet 220. Therefore, circulation airflow located in the box body 100 is formed and circularly flows in the first chamber 110 and the second chamber 120.

When the first heat dissipation airflow and the second heat dissipation airflow in the first chamber 110 exchange heat with the electronic component 400 in the first chamber 110, the heat generated during the operation of the electronic component 400 is exchanged into the first heat dissipation airflow and the second heat dissipation airflow in the first chamber 110. When air in the second chamber 120 exchanges heat with the heat exchanger 500, the heat carried in the air in the second chamber 120 is exchanged in a refrigerant in the heat exchanger 500, and the refrigerant flows out of the box body 100. Therefore, the heat generated during the operation of the electronic component 400 is exchanged to the outer side of the box body 100. The heat exchanger of the present disclosure may be a microchannel heat exchanger. The microchannel heat exchanger includes at least two groups of microchannels. The at least two groups of microchannels include a plurality of first microchannels through which a first refrigerant flow flows and a plurality of second microchannels through which a second refrigerant flow flows. The second refrigerant flow absorbs heat from the first refrigerant flow to subcool the first refrigerant flow, or the first refrigerant flow absorbs heat from the second refrigerant flow to subcool the second refrigerant flow.

The microchannel heat exchanger in the embodiments of the present disclosure may also be configured as an economizer for an air conditioner. In this way, the microchannel heat exchanger may not only be configured to cool the electronic components in the electric control box, but also configured as the economizer. Therefore, a need for an additional economizer arranged outside the electric control box can be avoided. Thus, a structure of the air conditioner is simplified. As a result, the space is saved, and cost can also be saved.

A structure of the box body 100 is described in detail below with reference to the accompanying drawings.

Figure 8:
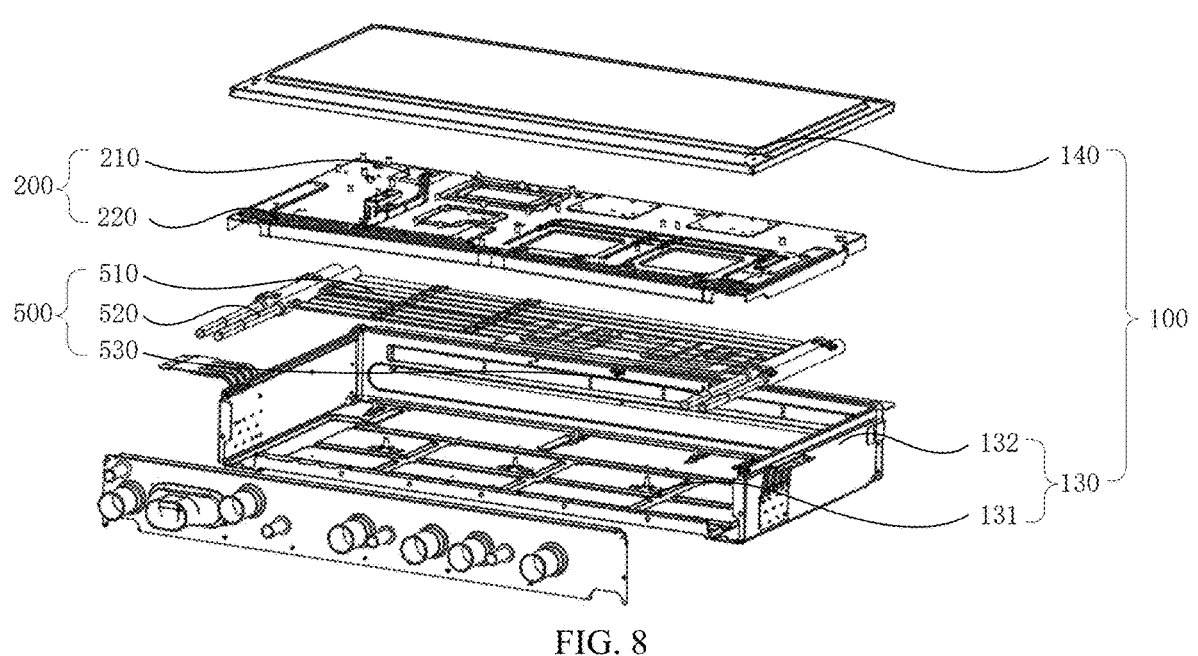
FIG. 8 is an exploded view of an electric control box according to an embodiment of the present disclosure.

In an embodiment illustrated in FIG. 8, the box body 100 includes a box body 130 and a box cover 140. The box body 130 includes a bottom plate 131 and a side plate 132 arranged at an edge of the bottom plate 131. A chamber having an opening is formed by the bottom plate 131 and the side plate 132. The box cover 140 covers the box body 130 to close the opening of the chamber. The bottom plate 131 may be a rectangular-shaped plate as illustrated in FIG. 8. The side plate 132 may be a rectangular-shaped ring. The box cover 140 may be a rectangular-shaped plate as illustrated in FIG. 8. A rectangular-shaped box is formed by the box body 130 and the box cover 140.

A structure of the mounting plate 200 is described in detail below with reference to the accompanying drawings.

The mounting plate 200 may be in a rectangular shape as illustrated in FIG. 7 and may be arranged in the box body 100 through threading, snapping, and welding, etc. For example, the mounting plate 200 may be provided with a bending plate at an edge of the mounting plate 200. The bending plate has a mounting hole. The box body 100 is provided with a fixing plate. The fixing plate may be an L-shaped plate. The fixing plate has an end welded to the box body 100 and another end having a cooperating hole. The mounting hole in the bending plate corresponds to the cooperating hole in the fixing plate. The mounting plate 200 can be fixed in the box body 100 by using a bolt and a screw mounted in the mounting hole and the cooperating hole.

In an embodiment illustrated in FIG. 7, the mounting plate 200 has a plurality of second air return inlets 220 arranged at intervals along a [first] second side of the mounting plate 200, the first air return inlet 210 is arranged at a second first side of the mounting plate 200, and the first side is opposite to the second side. For example, in the embodiment illustrated in FIG. 7, the first side is an upper side of the mounting plate, the second side is a lower side of the mounting plate, the first air return inlet 210 is arranged at an end of the first side, and the second air return inlet is arranged at an entire edge of the second side. In this way, a contact area between the air entering the second chamber 120 from the first chamber 110 and the heat exchanger 500 can be increased. Therefore, efficiency of heat exchange between the air in the second chamber 120 and the heat exchanger 500 is increased.

In some embodiments, the mounting plate 200 is a rectangular-shaped plate. The first air return inlet 210 is located at a first corner of the rectangular-shaped plate. The second air return inlet 220 is located at a second side corner of the rectangular-shaped plate. The second corner and the first corner are located at two ends of a same diagonal of the rectangular-shaped plate, respectively. Therefore, the air in the first chamber 110 may also enter the second chamber 120 through the second air return inlet 220, and the air in the second chamber 120 may also enter the first chamber 110 through the first air return inlet 210.

The first fan 300 is described in detail below with reference to the accompanying drawings.

The first fan 300 at the mounting plate 200 may be one of a centrifugal fan, an axial flow fan, and a cross-flow fan. In an embodiment illustrated in FIG. 1, the first fan 300 may be an axial fan. It can be understood that, for those skilled in the art, replacing the first fan 300 with a centrifugal fan or a cross-flow fan is a routine substitution.

Referring to FIG. 4 and FIG. 7, a casing of the first fan 300 is fixed to the mounting plate 200 through the threading, the first fan 300 has an inlet in communication with the first air return inlet 210 of the mounting plate 200 and an outlet facing towards the head end of the first heat dissipation path a. The first fan 300 sucks the air in the second chamber 120 into the first chamber 110 to form the first heat dissipation airflow in the first chamber 110.

The electric control box further includes a second fan 800, and the second fan 800 is described in detail below with reference to the accompanying drawings.

Referring to FIG. 4 and FIG. 6, the second fan 800 is arranged at the mounting plate 200 and located in the first chamber 110, and the second fan 800 is arranged on the first heat dissipation path a or the second heat dissipation path b. The second fan 800 may be one of a centrifugal fan, an axial flow fan, and a cross-flow fan.

In some embodiments, the second fan 800 is arranged at a head end of the second heat dissipation path b, the first heat dissipation path a is, for example, along a long edge at an upper side of the box body 100 illustrated in FIG. 1, the second heat dissipation path b is, for example, along a short edge at a right side of the box body 100 illustrated in FIG. 1, and the head end of the second heat dissipation path b is, for example, at a right upper corner position of the box body 100 illustrated in FIG. 1. In this case, the second fan 800 may be, for example, a cross-flow fan.

In some other embodiments, the second fan 800 is disposed at a tail end of the second heat dissipation path b, the first fan 300 has an air outlet direction that does not intersect an air outlet direction of the second fan 800, the second fan 800 is configured to form third heat dissipation airflow flowing along a third heat dissipation path c, and the second fan is, for example, a centrifugal fan. The third heat dissipation path c is, for example, along a long edge at the lower side of the box body 100 illustrated in FIG. 2. In this embodiment, the air outlet direction of the first fan 300 and the air outlet direction of the second fan 800 do not conflict. The air outlet direction of the first fan 300 and the air outlet direction of the second fan 800 are opposite to each other or relatively inclined. For example, the first fan 300 blows air to the right, the second fan 800 blows air downwards. For example, the first fan 300 blows air to the right, the second fan 800 blows air to the left, and the outlet of the first fan 300 is staggered with the outlet of the second fan 800.

The first fan 800 cooperates with the second fan 300 to regulate a flow rate and air volume of the air in the box body 100. In this way, heat exchange efficiency between the air in the first chamber 110 and the electronic component 400 in the first chamber 110 is increased. Therefore, the heat generated during the operation of the electronic component 400 is carried away in time. As a result, the operational stability of the electronic component 400 is increased.

The electronic component 400 is described below with reference to the accompanying drawings.

The plurality of electronic components 400 are divided into a first component group and a second component group that are arranged in a width direction of the box body 100. The first component group is arranged close to an upper edge of the box body 100, and the second component group is arranged close to a lower edge of the box body 100.

The number of electronic components 400 contained in the first component group is not specifically limited, and may be one, two, three, etc. For example, when three electronic components in the first component group are provided, three electronic components 400 in the first component group are arranged at intervals along the first heat dissipation path a.

Figure 9:
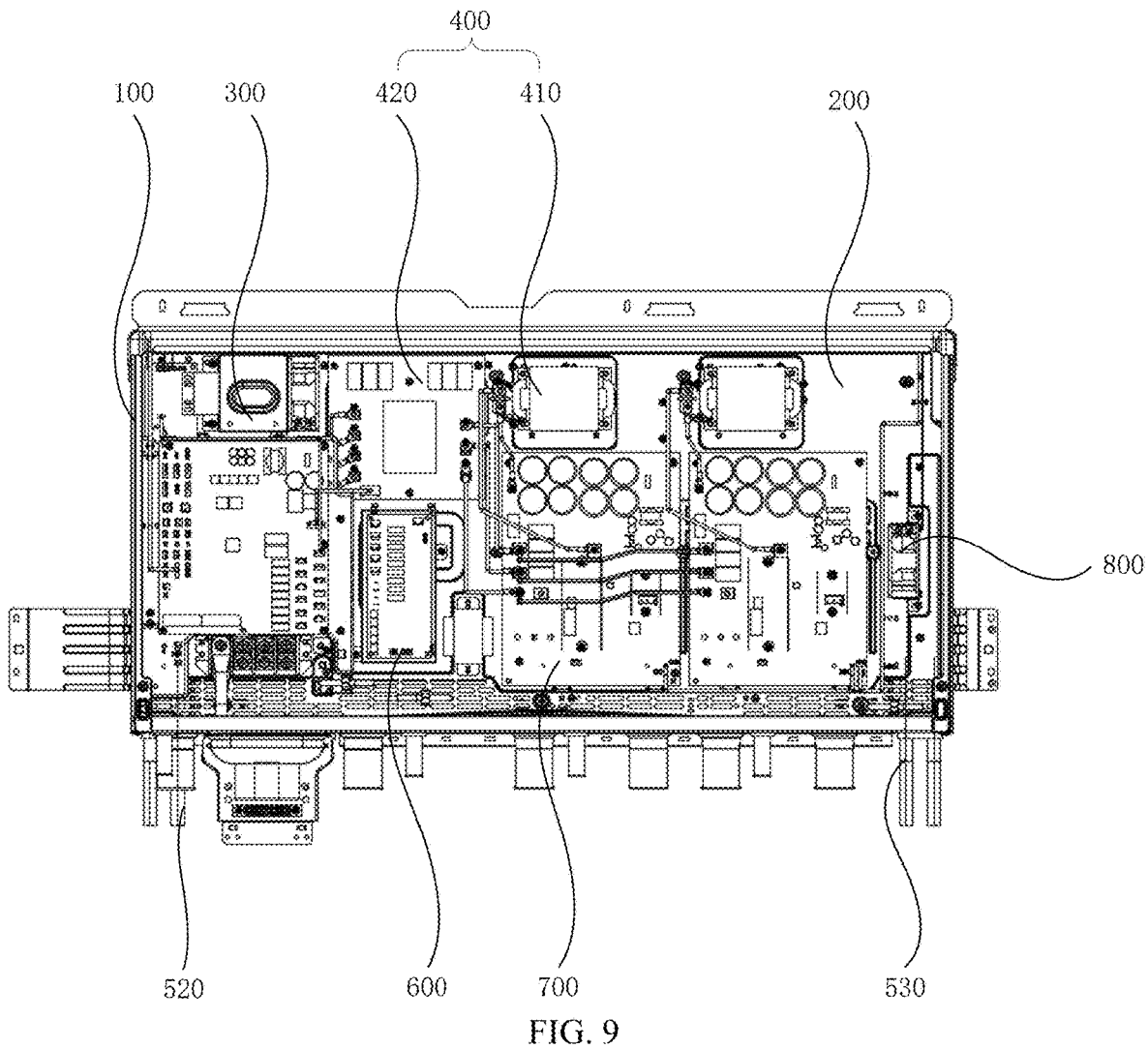
FIG. 9 is a schematic structural view 7 of an electric control box according to an embodiment of the present disclosure.

In the embodiment illustrated in FIG. 9, the first component group may include a reactor 410 and a filter 420, two reactors 410 may be provided, the filter 420 and the reactor 410 are arranged at intervals in a flow direction of the first heat dissipation airflow, and the filter 420 is arranged upstream of the reactor 410. In FIG. 9, the filter 420 and the reactor 410 are arranged in a length direction of the box body 100 illustrated in FIG. 9, the filter 420 is close to the head end of the first heat dissipation path a, and the reactor 410 is close to the tail end of the first heat dissipation path a.

The number of the electronic components 400 contained in the second component group is not specifically limited, and may be one, two, three, etc. For example, when four electronic components in the second component group are provided, four electronic components 400 in the second component group are arranged at intervals along the second heat dissipation path b.

In the embodiment illustrated in FIG. 9, the electric control box further includes an extension plate 600 and an electric control module assembly 700, two electric control module assemblies 700 may be provided, and the extension plate 600 and the electric control module assembly 700 are located in the box body 100, and the extension plate 600 and the electric control module assembly 700 are located in the first chamber 110. The second component group includes the expansion board 600 and the electric control module assembly 700 that are circuit plates. The extension plate 600 and the electric control module assembly 700 are arranged at intervals along the second heat dissipation path b. An arrangement direction of the expansion board 600 and the electric control module assembly 700 is parallel to the length direction of the box body 100 illustrated in FIG. 9. The extension plate 600 is opposite to the filter 420, and the electric control module assembly 700 is opposite to the reactor 410. As illustrated in FIG. 5 and FIG. 6, in the width direction of the box body 100, the filter 420 protrudes towards the extension plate 600 relative to the reactor 410.

The heat exchanger 500 is described below with reference to the accompanying drawings.

Referring to FIG. 8, a part of the heat exchanger 500 is located inside the box body 100, and a part of the heat exchanger 500 outside the box body 100 is in communication with a condenser outside the electric control box. There is a flowing refrigerant inside the heat exchanger 500, and the refrigerant circulates in the heat exchanger 500 and the condenser. The heat exchanger 500 may be arranged inside the second chamber 120, and the heat exchanger 500 may exchange heat with air flowing from the first chamber 110 to the second chamber 120. The air flowing from the first chamber 110 to the second chamber 120 is air after exchanging heat with the electronic components 400 in the first chamber 110. After the heat exchanger 500 exchanges the heat with the air flowing from the first chamber 110 to the second chamber 120, heat carried by the air flowing from the first chamber 110 to the second chamber 120 is exchanged into a refrigerant in the heat exchanger 500. The refrigerant flows into the condenser located outside the box body 100, and the condenser exchanges heat with air outside the box body 100. In this way, the heat generated during the operation of the electronic components 400 is exchanged to the outer side of the box body 100.

With continued reference to FIG. 8, the heat exchanger 500 generally includes a refrigerant heat exchange portion 510 having an entry inlet and an output outlet. The refrigerant enters an inner side of the refrigerant heat exchange portion 510 through the entry inlet and flows from the inner side of the refrigerant heat exchange portion 510 to an outer side of the refrigerant heat exchange portion 510 through the output outlet.

The refrigerant heat exchange portion 510 is arranged in the second chamber 120. The refrigerant circulates inside the refrigerant heat exchange portion 510. The air flowing from the first chamber 110 to the second chamber 120 is in contact with the refrigerant heat exchange portion 510. The refrigerant heat exchange portion 510 exchanges heat with the air in the second chamber 120. Heat carried by the air in the second chamber 120 is exchanged into a refrigerant inside the refrigerant heat exchange portion 510. The refrigerant carrying the heat flows to the condenser outside the box body 100. The heat carried in the refrigerant in the condenser is exchanged into the air outside the box body 100. In this way, the heat generated during the operation of the electronic component 400 is exchanged into the air outside the box body 100 to enable the operational reliably of the electronic component 400.

With continued reference to FIG. 8, the heat exchanger 500 further includes a refrigerant entry pipe 520 and a refrigerant output pipe 530. The refrigerant entry pipe 520 has a first end in communication with the entry inlet of the refrigerant heat exchange portion 510 and a second end located outside the box body 100 and in communication with the condenser. The refrigerant output pipe 530 has a first end in communication with the output outlet of the refrigerant heat exchange portion 510 and a second end located outside the box body 100. Moreover, the refrigerant output pipe 530 is in communication with the condenser. In this way, the heat exchanger 500 is in communication with the condenser outside the box body 100.

The electric control box of the embodiments of the present disclosure may be arranged at an air conditioner, for example, arranged at an air conditioner outdoor unit of a central air conditioner. The condenser connected to the second end of the refrigerant output pipe 530 and the second end of the refrigerant entry pipe 520 may be a condenser of the central air conditioner. In this way, heat exchange between the refrigerant and the air inside the electric control box can be achieved by using the refrigerant in an operating process of the central air conditioner to allow the refrigerant to exchange the heat generated during the operation of the electronic component 400 to the outside of the electric control box.

In an embodiment where the heat exchanger 500 is provided, for example, as illustrated in FIG. 5 and FIG. 8, the box body 100 has a first through hole 133 and a second through hole 134. The refrigerant entry pipe 520 passes through and is fitted into the first through hole 133, and the refrigerant output pipe 530 passes through and is fitted into the second through hole 134. Moreover, the first end of the refrigerant entry pipe 520 is located inside the electric control box, and the second end of the refrigerant entry pipe 520 is located outside the electric control box. The first end of the refrigerant output pipe 530 is located inside the electric control box, and the second end of the refrigerant output pipe 530 is located outside the electric control box.

In an embodiment where the heat exchanger 500 is provided, a first sealing ring is provided between the refrigerant entry pipe 520 and the box body 100 and configured to seal the refrigerant entry pipe 520 and a hole wall of the first through hole 133. A second sealing ring is provided between the refrigerant output pipe 530 and the box body 100 and configured to seal the refrigerant output pipe 530 and a hole wall of the second through hole 134. In this way, liquid such as rainwater outside the electric control box can be prevented from entering the electric control box through the first through hole 133 and the second through hole 134. Therefore, the electronic component 400 has high safety in use.

Figure 10:
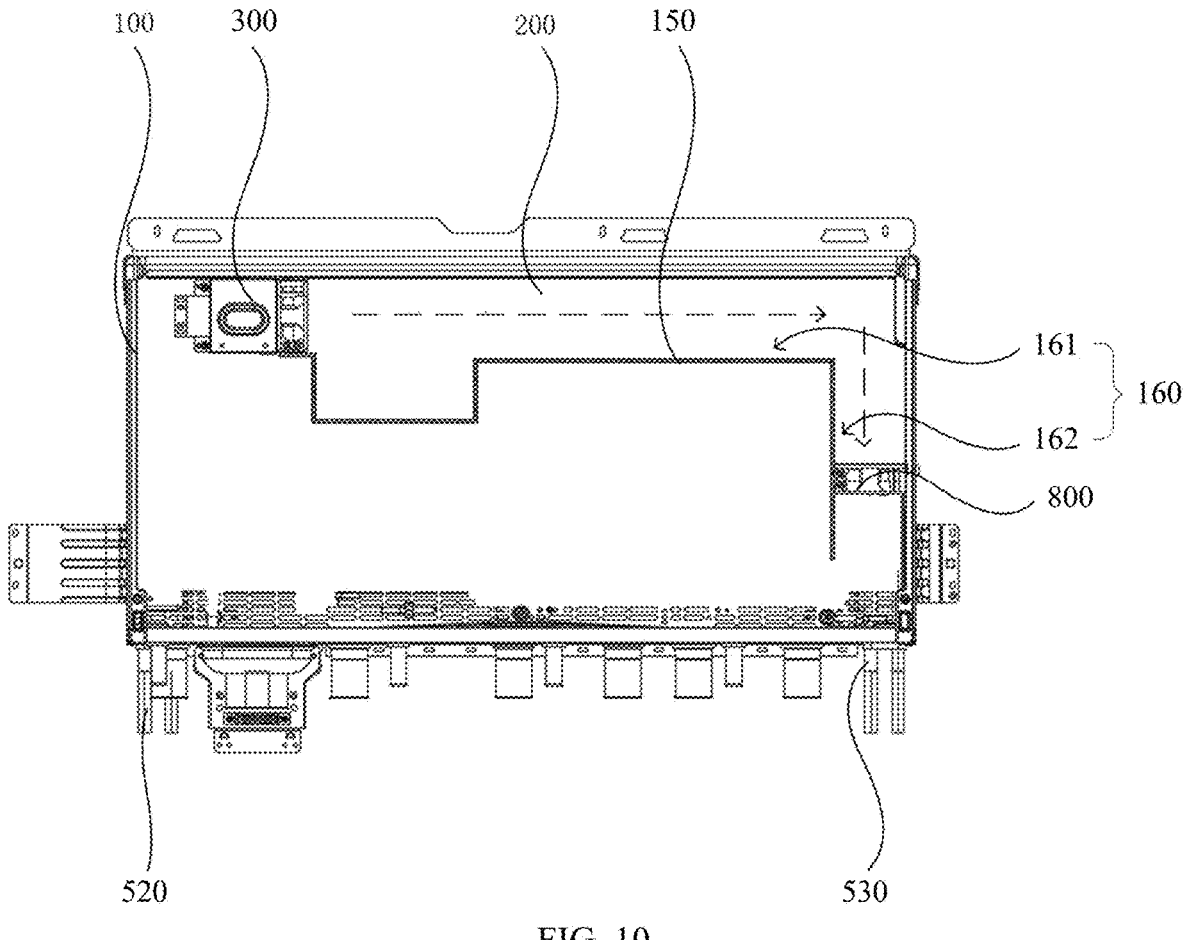
FIG. 10 is another schematic structural view of an electric control box according to an embodiment of the present disclosure.
Figure 11:
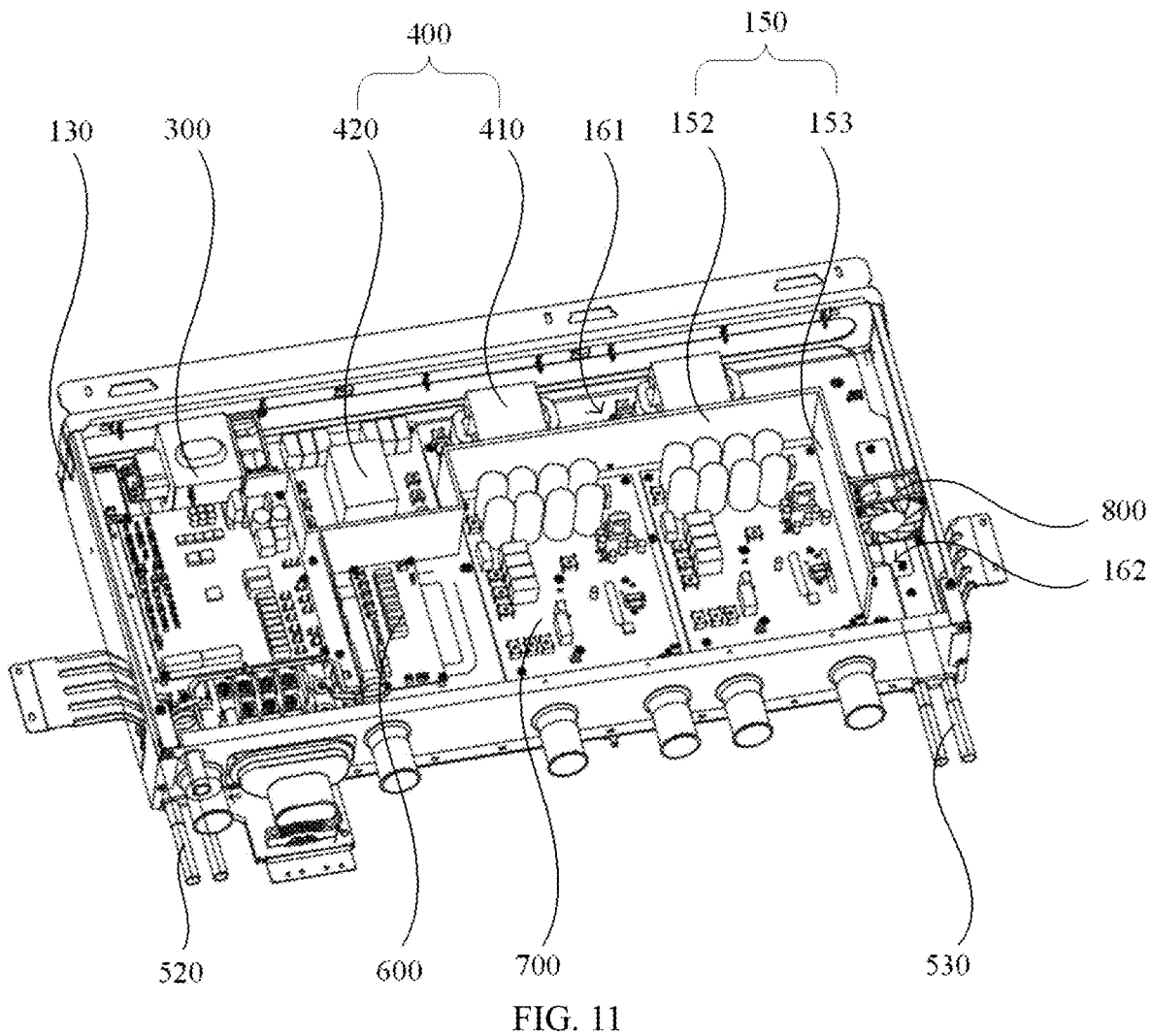
FIG. 11 is another schematic structural view 2 of an electric control box according to an embodiment of the present disclosure.
Figure 12:
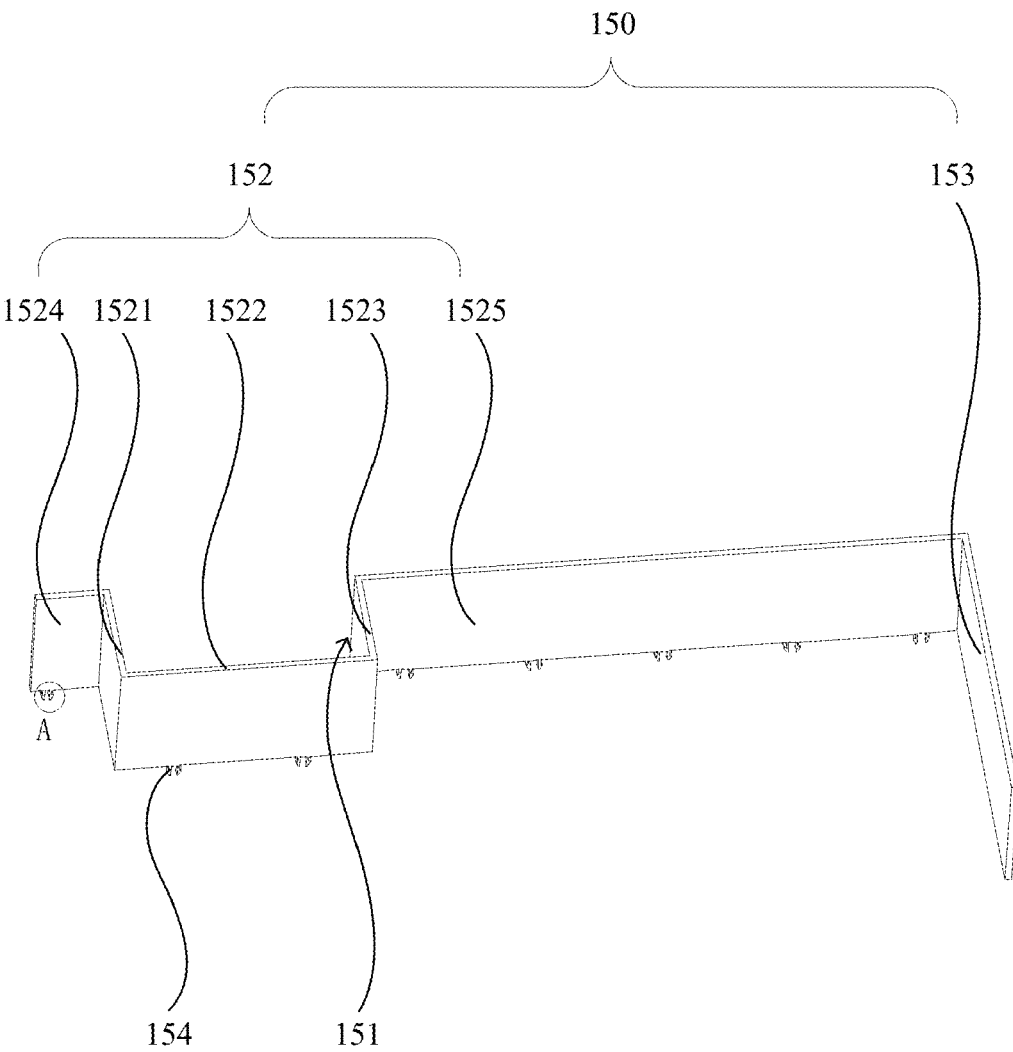
FIG. 12 is a schematic structural view of an air duct partition plate of an electric control box according to an embodiment of the present disclosure.
Figure 13:
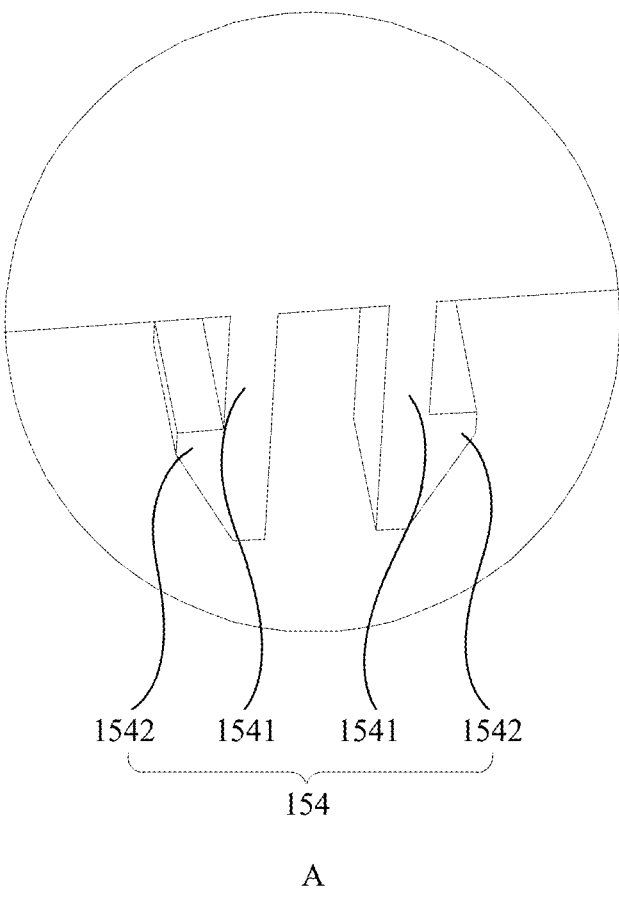
FIG. 13 is a partial view of a position A illustrated in FIG. 12.

FIG. 10 is another schematic structural view of an electric control box according to an embodiment of the present disclosure, FIG. 11 is another schematic structural view 2 of an electric control box according to an embodiment of the present disclosure, FIG. 12 is a schematic structural view of an air duct partition plate of an electric control box according to an embodiment of the present disclosure, and FIG. 13 is a partial view of a position A illustrated in FIG. 12.

Referring to FIG. 1 to FIG. 13, in some embodiments, the electric control box of the embodiment of the present disclosure includes a box body 100, a mounting plate 200, a first fan 300, and an air duct partition plate 150. A mounting space is formed in the box body 100. The mounting plate 200, the first fan 300, and the air duct partition plate 150 may be arranged in the mounting space. The box body 100 is configured to protect the mounting plate 200, the air duct partition plate 150, the first fan 300 that are arranged in the mounting space. The mounting plate 200 is located in the box body 100 and provided with a plurality of electronic components 400. The air duct partition plate 150 is located in the box body 100 and is fixed to the mounting plate 200. A cooling air duct 160 is formed by the air duct partition plate 150 and the mounting plate 200 and the box body 100. At least some of the plurality of electronic components 400 are located in the cooling air duct 160. The first fan 300 is configured to drive air to flow in the cooling air duct 160 to form the first heat dissipation airflow. The first heat dissipation airflow exchanges heat with the electronic components 400 located in the cooling air duct 160 to take away heat generated during operation of the electronic components 400 in the cooling air duct 160.

In the electric control box according to the embodiments of the present disclosure, the cooling air duct 160 is formed by the air duct partition plate 150, the mounting plate 200 and the box body 100, and the air is driven by the first fan 300 to flow in the cooling air duct to form the first heat dissipation airflow. The first heat dissipation airflow is in contact with and exchanges heat with the electronic component 400 located in the cooling air duct 160, and the heat generated during the operation of the electronic component 400 in the cooling air duct 160 is taken away by the first heat dissipation airflow. In this way, the temperature of the electronic component 400 is reduced. Therefore, the operational reliability of the electronic component 400 is improved.

The first fan 300 is further configured to form second heat dissipation airflow located outside the cooling air duct 160, the first heat dissipation airflow and the second heat dissipation airflow are connected end to end sequentially to form circulation airflow located inside the box body 100. The second heat dissipation airflow and the first heat dissipation airflow are both located on two sides of the air duct partition plate 150.

The mounting plate 200 divides the chamber in the box body 100 into the first chamber 110 and the second chamber 120. Each of the first fan 300, the plurality of electronic components 400, and the air duct partition plate 150 is arranged in the first chamber 110. The heat exchanger 500 is arranged in the second chamber 120.

In some embodiments, the first heat dissipation airflow and the second heat dissipation airflow may be both located in the first chamber 110. In this case, circulation airflow may be formed in the first chamber 110.

In some other embodiments, the second heat dissipation airflow is located in the second chamber 120, and the first heat dissipation airflow is located in the first chamber 110. A first end of the first heat dissipation airflow is in communication with a first end of the second heat dissipation airflow, and a second end of the first heat dissipation airflow is in communication with a second end of the second heat dissipation airflow.

In the above embodiments, the mounting plate 200 has a first air return inlet 210 and a second air return inlet 220 that penetrate the mounting plate 200. The first air return inlet 210 is in communication with the inlet of the first fan 300. The outlet of the first fan 300 is in communication with the head end of the cooling air duct 160. The second air return inlet 220 is formed at a tail end of the cooling air duct 160. The second heat dissipation airflow passing through the first air return inlet 210 and the second air return inlet 220 is formed in the second cavity 120. The first air return inlet 210 and the second air return inlet 220 may enable the first heat dissipation airflow located in the first chamber 110 and the second heat dissipation airflow located in the second chamber 120 to circulate to form circulation airflow.

In the above embodiments, the first heat dissipation airflow takes away the heat generated during the operation of the electronic component in the first chamber 110 and enters the second chamber 120 through the second air return inlet 220, the second heat dissipation airflow exchanges the heat with the heat exchanger 500 located in the second chamber 120 and enters the first chamber 110 through the first air inlet 210, and the first heat dissipation airflow and the second heat dissipation airflow circulate. In this way, the heat generated during the operation of the electronic component 400 is exchanged into the refrigerant in the heat exchanger 500, and the refrigerant in the heat exchanger 500 flows to the outer side of the electric control box and carries the heat out of the electric control box. As a result, the temperature of the electronic component 400 is reduced. Therefore, the operational reliability of the electronic component 400 is improved.

In the electric control box of the embodiments of the present disclosure, a flat surface perpendicular to an extension direction of the cooling air duct 160 is a cross section. A cross-sectional area of the cooling air duct 160 may remain unchanged all the time in a flow direction of air in the cooling air duct 160, but is not limited thereto. The cross-sectional area of the cooling air duct 160 may also be changed in the flow direction of the air in the cooling air duct 160. For example, the cross-sectional area of the cooling air duct 160 gradually decreases in the flow direction of air in the cooling air duct 160. For example, a cross-sectional area of a middle portion of the cooling air duct 160 is greater than a cross-sectional area of each of two end portions of the cooling air duct 160.

The box body 100 is described in detail below with reference to the accompanying drawings. The box body 100 includes a box body 130 and a box cover 140, the box body 130 includes a bottom plate 131 and a side plate 132 arranged at an edge of the bottom plate 131. A chamber having an opening is formed by the bottom plate 131 and the side plate 132. The box cover 140 covers the box body 130 to close the opening of the chamber. The box body 100 formed by the box body 130 and the box cover 140 is a sealed housing. The bottom plate 131 may be a rectangular-shaped plate. The side plate 132 may be a rectangular-shaped ring. The box cover 140 may be a rectangular-shaped plate. A rectangular-shaped box is formed by the box body 130 and the box cover 140.

The box body 100 has a first through hole 133 and a second through hole 134. The refrigerant entry pipe 520 passes through and is fitted into the first through hole 133. The refrigerant output pipe 530 passes through and is fitted into the second through hole 134.

A structure of the mounting plate 200 is described in detail below with reference to the accompanying drawings.

The mounting plate 200 may be in a rectangular shape and may be arranged in the box body 100 through threading, snapping, and welding, etc. For example, the mounting plate 200 may be provided with a bending plate at an edge of the mounting plate 200. The bending plate has a mounting hole. The box body 100 is provided with a fixing plate. The fixing plate may be an L-shaped plate. The fixing plate has an end welded to the box body 100 and another end having a cooperating hole. The mounting hole in the bending plate corresponds to the cooperating hole in the fixing plate. The mounting plate 200 can be fixed in the box body 100 by using a bolt and a screw mounted in the mounting hole and the cooperating hole.

The mounting plate 200 has a plurality of second air return inlets 220 arranged at intervals along a second side of the mounting plate 200. The first air return inlet 210 is arranged at a first side of the mounting plate 200. The first side is opposite to the second side. For example, the first side is an upper side of the mounting plate, the second side is a lower side of the mounting plate, the first air return inlet 210 is arranged at an end of the first side, and the second air return inlet is arranged at an entire edge of the second side. In this way, the contact area between the air entering the second chamber 120 from the first chamber 110 and the heat exchanger 500 can be increased. Therefore, the efficiency of heat exchange between the air in the second chamber 120 and the heat exchanger 500 is increased.

The heat exchanger 500 is described in detail below with reference to the accompanying drawings.

The heat exchanger 500 generally includes a refrigerant heat exchange portion 510 having an entry inlet and an output outlet. The refrigerant enters an inner side of the refrigerant heat exchange portion 510 through the entry inlet and flows from the inner side of the refrigerant heat exchange portion 510 to an outer side of the refrigerant heat exchange portion 510 through the output outlet.

The heat exchanger 500 further includes a refrigerant entry pipe 520 and a refrigerant output pipe 530. The refrigerant entry pipe 520 has a first end located inside the electric control box and in communication with the entry inlet of the refrigerant heat exchange portion 510. The refrigerant output pipe 530 has a first end located inside the electric control box and in communication with the output outlet of the refrigerant heat exchange portion 510. The refrigerant entry pipe 520 has a second end located outside the electric control box. The refrigerant output pipe 530 has a second end located outside the electric control box. The second end of the refrigerant output pipe 530 and the second end of the refrigerant entry pipe 520 are both in communication with the condenser. In this way, a refrigerant circulation is achieved.

The electric control box of the embodiments of the present disclosure may be arranged at an air conditioner, for example, arranged at an air conditioner outdoor unit of a central air conditioner. The condenser connected to the second end of the refrigerant output pipe 530 and the second end of the refrigerant entry pipe 520 may be a condenser of the central air conditioner. In this way, heat exchange between the refrigerant and the second heat dissipation airflow inside the second chamber 120 can be achieved by using the refrigerant in an operating process of the central air conditioner. Therefore, the operational reliability of the electronic component 400 is high.

A first sealing ring is provided between the refrigerant entry pipe 520 and the box body 100 and configured to seal the refrigerant entry pipe 520 and a hole wall of the first through hole. A second sealing ring is provided between the refrigerant output pipe 530 and the box body 100 and configured to seal the refrigerant output pipe 530 and a hole wall of the second through hole. In this way, liquid such as rainwater outside the electric control box can be prevented from entering the electric control box through the first through hole and the second through hole. Therefore, the electronic component 400 has high safety in use.

In some embodiments, the mounting plate 200 is fixed at the box body 100, and the heat exchanger 500 is fixed to the mounting plate 200. The mounting plate 200 may be connected to the box body through at least one of threading, snapping, and welding. For example, the mounting plate 200 may be provided with a bending plate at an edge of the mounting plate 200. The bending plate has a mounting hole. The box body 100 is provided with a fixing plate. The fixing plate may be an L-shaped plate. The fixing plate has an end welded to the box body 100 and another end having a cooperating hole. The mounting hole in the bending plate corresponds to the cooperating hole in the fixing plate. The mounting plate 200 can be fixed in the box body 100 by using a bolt and a screw mounted in the mounting hole and the cooperating hole.

The heat exchanger of the present disclosure may be a microchannel heat exchanger. The microchannel heat exchanger includes at least two groups of microchannels. The at least two groups of microchannels include a plurality of first microchannels through which a first refrigerant flow flows and a plurality of second microchannels through which a second refrigerant flow flows. The second refrigerant flow absorbs heat from the first refrigerant flow to subcool the first refrigerant flow, or the first refrigerant flow absorbs heat from the second refrigerant flow to subcool the second refrigerant flow.

The microchannel heat exchanger in the embodiments of the present disclosure may also be configured as an economizer for an air conditioner. In this way, the microchannel heat exchanger may not only be configured to cool the electronic components in the electric control box, but also configured as the economizer. Therefore, a need for an additional economizer arranged outside the electric control box can be avoided. Thus, a structure of the air conditioner is simplified. As a result, the space is saved, and cost can also be saved.

The air duct partition plate 150 is described in detail below with reference to the accompanying drawings.

The air duct partition plate 150 includes a main plate body 152 and a secondary plate body 153. The main plate body 152 is connected to the secondary plate body 153. In an actual product, the main plate body 152 and the secondary plate body 153 may be of an integrated structure. For example, the main plate body 152 and the secondary plate body 153 may be integrally formed through injection molding or stamping molding.

The main plate body 152 may be connected to the secondary plate body 153 through the threading. For example, a first threaded hole is formed in the main plate body 152, and a second threaded hole is formed in the secondary plate body 153. A side surface of the main plate body 152 is opposite to an end surface of the secondary plate body 153, and the first threaded hole corresponds to the second threaded hole. The main plate body 152 is connected to the secondary plate body 153 through threaded fasteners arranged in the first threaded hole and the second threaded hole. The main plate body 152 may also be connected to the secondary plate body 153 through at least one of the snapping, the welding, and the threading.

In some embodiments, the main plate body 152 may be provided with a buckle 154 at a side of the main plate body 152 facing towards the mounting plate 200, the secondary plate body 153 is provided with a buckle 154 at a side of the secondary plate body 153 facing towards the mounting plate 200, and the mounting plate 200 is provided with a bayonet corresponding to the buckle 154. The air duct partition plate 150 is mounted at the mounting plate 200 by snapping the buckle 154 at the main plate body 152 and the buckle 154 at the secondary plate body 153 into the bayonets. A structure of the buckle 154 may be a structure illustrated in FIG. 9, each buckle 154 includes two cantilevers 1541 and a protrusion 1542 arranged at each of the two cantilever 1541, and in each buckle 154, the two protrusions 1542 arranged at the two cantilevers 1541 face away from each other.

The main plate body 152 is arranged relative to the secondary plate body 153 at an angle. For example, the angle between the main plate body 152 and the secondary plate body 153 is 90°, 100°, 80°, etc.

The first air duct 161 is formed by the main plate body 152, the mounting plate 200, the side plate 132, and the box cover 140. The second air duct 162 is formed by the secondary plate body 153, the mounting plate 200, the side plate 132, and the box cover 140. An air outlet end of the first air duct 161 is in communication with an air inlet end of the second air duct 162. The above cooling air duct 160 is formed by the first air duct 161 and the second air duct 162.

The air duct partition plate 150 has a recess 151 configured to avoid an electronic component 400 facing towards the recess 151. In this way, the electronic components 400 of different sizes can be arranged in the cooling air duct 160, and the air flowing in the cooling air duct 160 can also be ensured.

The recess 151 may be formed at the main plate body 152 of an integrated structure, and the recess 151 may be formed by bending the main plate body 152. The main plate body 152 may also be formed by sequentially connecting a first end plate 1524, a first plate body 1521, a second plate body 1522, a third plate body 1523, and a second end plate 1525. In this case, the recess 151 may be formed by the first plate body 1521, the second plate body 1522, and the third plate body 1523. An opening of the recess 151 faces towards an inner side of the cooling air duck 160.

A first end of the first plate body 1521 is connected to a first end of the second plate body 1522. A second end of the second plate body 1522 is connected to a first end of the third plate body 1523. A second end of the third plate body 1523 is connected to a first end of the second end plate 1525. A second end of the second end plate 1525 is connected to the secondary plate body 153. A first end of the first end plate 1524 is connected to a second end of the first plate body 1521. A second end of the first end plate 1524 corresponds to an air inlet end of the first air duct 161. The second end of the second end plate 1525 corresponds to an air outlet end of the first air duct 161.

A length of the first plate body 1521 may be or may not be equal to a length of the third plate body 1523. For example, in FIG. 3 and FIG. 5, a length of the first plate body 1521 is greater than a length of the third plate body 1523. In such design, cross-sectional areas of the first air duck 161 a position of the first end plate 1524, a position of the second plate body 1522, and a position of the second end plate 1525 may be different. Therefore, the electronic components 400 of different sizes are easily arranged inside the first air duck 161.

The electronic component 400 is described in detail below with reference to the accompanying drawings.

In some embodiments, each of the plurality of electronic components 400 may be arranged in the cooling air duct 160, and the heat generated during the operation of the electronic component 400 is carried away in time by using the first heat dissipation airflow flowing in the cooling air duct 160.

In some other embodiments, some of the plurality of electronic components 400 are arranged in the cooling air duct 160, the remaining electronic components 400 are arranged outside the cooling air duct 160. Moreover, the electronic component 400 sensitive to a temperature change may be arranged in the cooling air duct 160, and the electronic component 400 that is less sensitive to the temperature change is arranged outside the cooling air duct 160. Alternatively, an electronic component 400 that generates a relatively large amount of heat and is easily affected by the temperature in an operation state may be arranged in the cooling air duct 160, and an electronic component 400 that generates a relatively small amount of heat and is not easily affected by the temperature in the operation state is arranged outside the cooling air duct 160.

The plurality of electronic components 400 and the air duct partition plate 150 are located in a same side of the mounting plate 200, and some of the plurality of electronic components 400 are located in the cooling air duct 160. That is, some of the electronic components 400 are located at a first side of the air duct partition plate 150, and the remaining electronic components 400 are located at a second side of the air duct partition plate 150. The first side of the air duct partition plate 150 is, for example, an upper side illustrated in FIG. 3, and the second side of the air duct partition plate 150 is, for example, a lower side illustrated in FIG. 3. The first side of the air duct partition plate 150 is opposite to the second side of the air duct partition plate 150.

The plurality of electronic components 400 may include a reactor 410 and a filter 420. Two reactors 410 may be provided. The filter 420 and the reactor 410 are arranged at intervals in the flow direction of the first heat dissipation airflow. When the reactor 410 and the filter 420 are arranged in the cooling air duct 160, the filter 420 is arranged upstream of the reactor 410. When the filter 420 and the reactor 410 are arranged in the first air duct 161, the filter 420 and the reactor 410 are arranged in the length direction of the box body 100, the filter 420 is close to the air inlet end of the first air duct 161, and the reactor 410 is close to the air outlet end of the first air duct 161.

In some embodiments, the electronic control box further includes an expansion board 600 and an electric control module assembly 700. Each of the expansion board 600 and the electric control module assembly 700 may be a circuit plate. The expansion board 600 and the electric control module assembly 700 are located in the box body 100. Two electric control module assemblies 700 may be provided, and the extension plate 600 and the electric control module assembly 700 are arranged at intervals in the extension direction of the air duct partition plate 150.

The extension plate 600 and the electric control module assembly 700 are located outside the cooling air duct 160. An arrangement direction of the expansion board 600 and the electric control module assembly 700 is parallel to the length direction of the box body 100 illustrated in FIG. 3. The expansion board 600 is opposite to the filter 420. The electric control module assembly 700 is opposite to the reactor 410.

In the width direction of the box body 100, the filter 420 protrudes towards the extension plate 600 relative to the reactor 410, and the electric control module assembly 700 protrudes towards the reactor 410 relative to the expansion board 600. In this case, the first plate body 1521, the second plate body 1522, and the third plate body 1523 surround an end of the filter 420 close to the expansion board 600.

The first fan 300 is described in detail below with reference to the accompanying drawings.

The first fan 300 may be one of a centrifugal fan, an axial flow fan, and a cross-flow fan. In an embodiment illustrated in FIG. 1, the first fan 300 may be an axial fan. It can be understood that, for those skilled in the art, replacing the first fan 300 with a centrifugal fan or a cross-flow fan is a routine substitution. The first fan 300 may be arranged at the mounting plate 200 through at least one of threading, welding, and snapping.

The first fan 300 is fixed to the mounting plate 200 through the threading. The inlet of the first fan 300 is in communication with the first air return inlet 210 of the mounting plate 200. The first fan 300 is arranged at the air inlet end of the first air duck 161. The first fan 300 sucks the air in the second chamber 120 into the first chamber 110 to form the first heat dissipation airflow in the first chamber 110. The outlet of the first fan 300 is in communication with the air inlet end of the cooling air duct 160.

The electric control box further includes a second fan 800, and the second fan 800 is described in detail below with reference to the accompanying drawings.

The second fan 800 is arranged at the mounting plate 200 and located in the first chamber 110. The second fan 800 may be one of a centrifugal fan, an axial flow fan, and a cross-flow fan.

In some embodiments, the second fan 800 is arranged in the cooling air duct 160, the air outlet direction of the second fan 800 is the same as a direction of the first heat dissipation airflow. The first fan 300 has an air outlet direction from left to right, and the second fan 800 has an air outlet direction from top to bottom.

The first fan 800 cooperates with the second fan 300 to regulate a flow rate and air volume of the air in the box body 100. In this way, heat exchange efficiency between the air in the first chamber 110 and the electronic component 400 in the first chamber 110 is increased. Therefore, the heat generated during the operation of the electronic component 400 is carried away in time. As a result, the operational stability of the electronic component 400 is increased.

Figure 14:
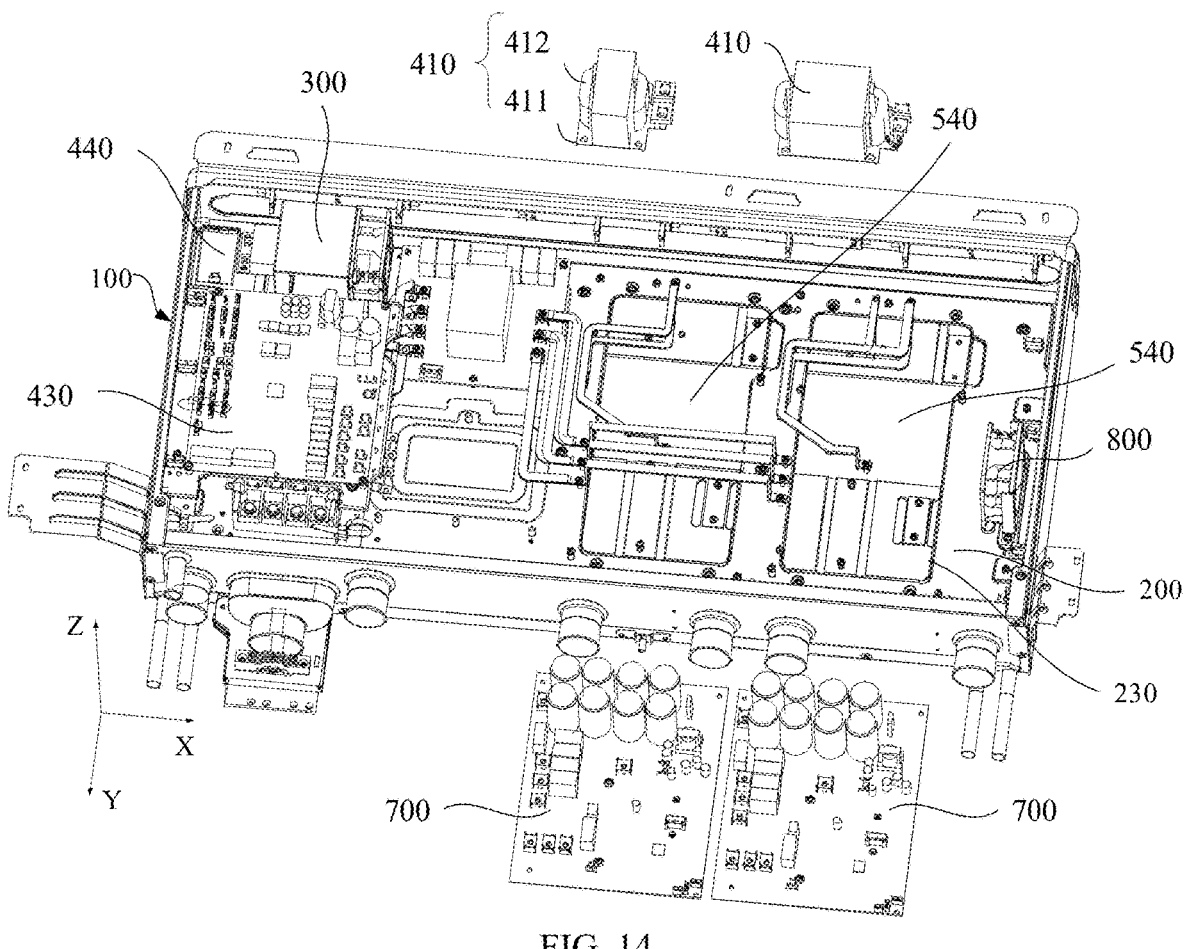
FIG. 14 is a schematic exploded view of an electric control box after a box cover is removed according to an embodiment of the present disclosure.
Figure 15:
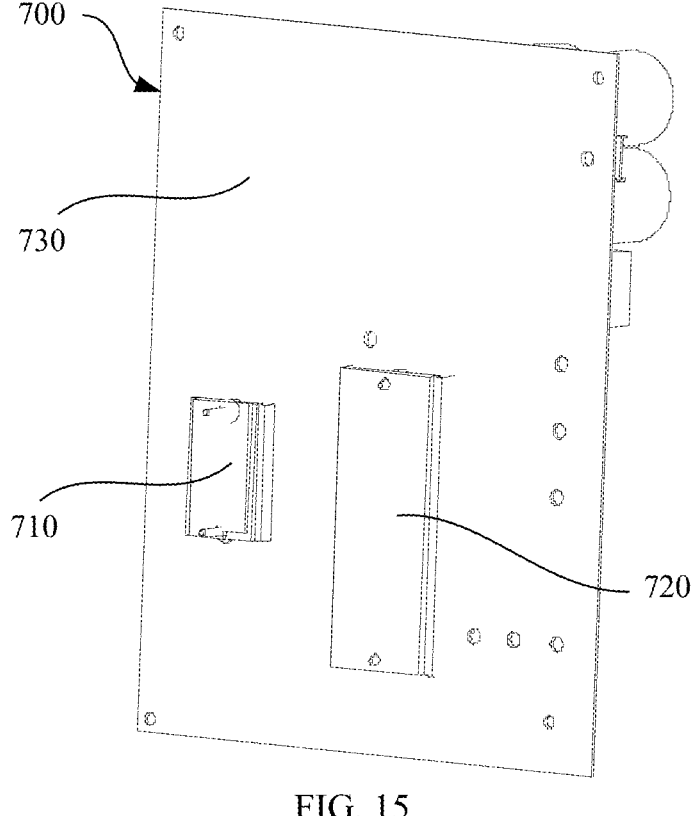
FIG. 15 is a schematic structural view of an electric control module assembly of an electric control box according to an embodiment of the present disclosure.
Figure 16:
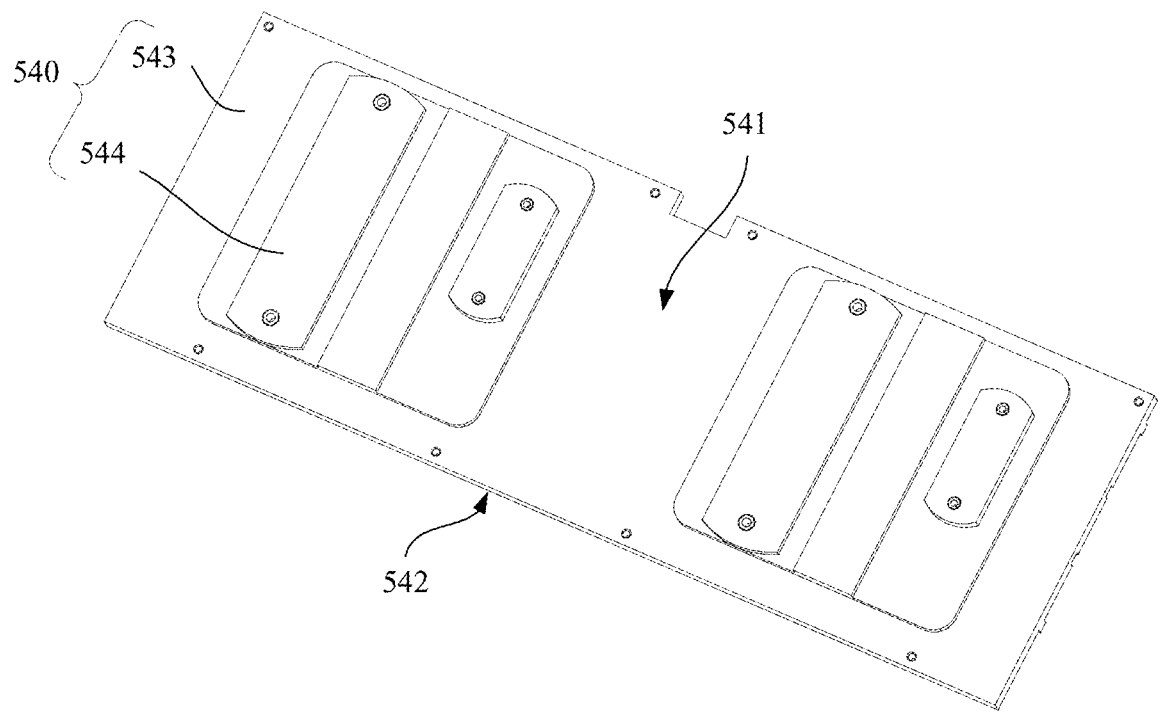
FIG. 16 is a schematic structural view of a heat dissipation plate according to an embodiment of the present disclosure.

FIG. 14 is a schematic exploded view of an electric control box after a box cover is removed according to an embodiment of the present disclosure, FIG. 15 is a schematic structural view of an electric control module assembly of an electric control box according to an embodiment of the present disclosure, and FIG. 16 is a schematic structural view of a heat dissipation plate according to an embodiment of the present disclosure.

Referring to FIG. 1 to FIG. 16, in some embodiments, the electric control box according to the present disclosure includes a box body 100 having a closed accommodation cavity 101, a heat dissipation assembly, and an electric control module assembly 700. The box body 100 is configured to accommodate the heat dissipation assembly and the electric control module assembly 700. The heat dissipation assembly is configured for heat dissipation. The electric control module assembly 700 is configured to control an operation state of a fan and a compressor of the air conditioner outdoor unit.

Figure 3:
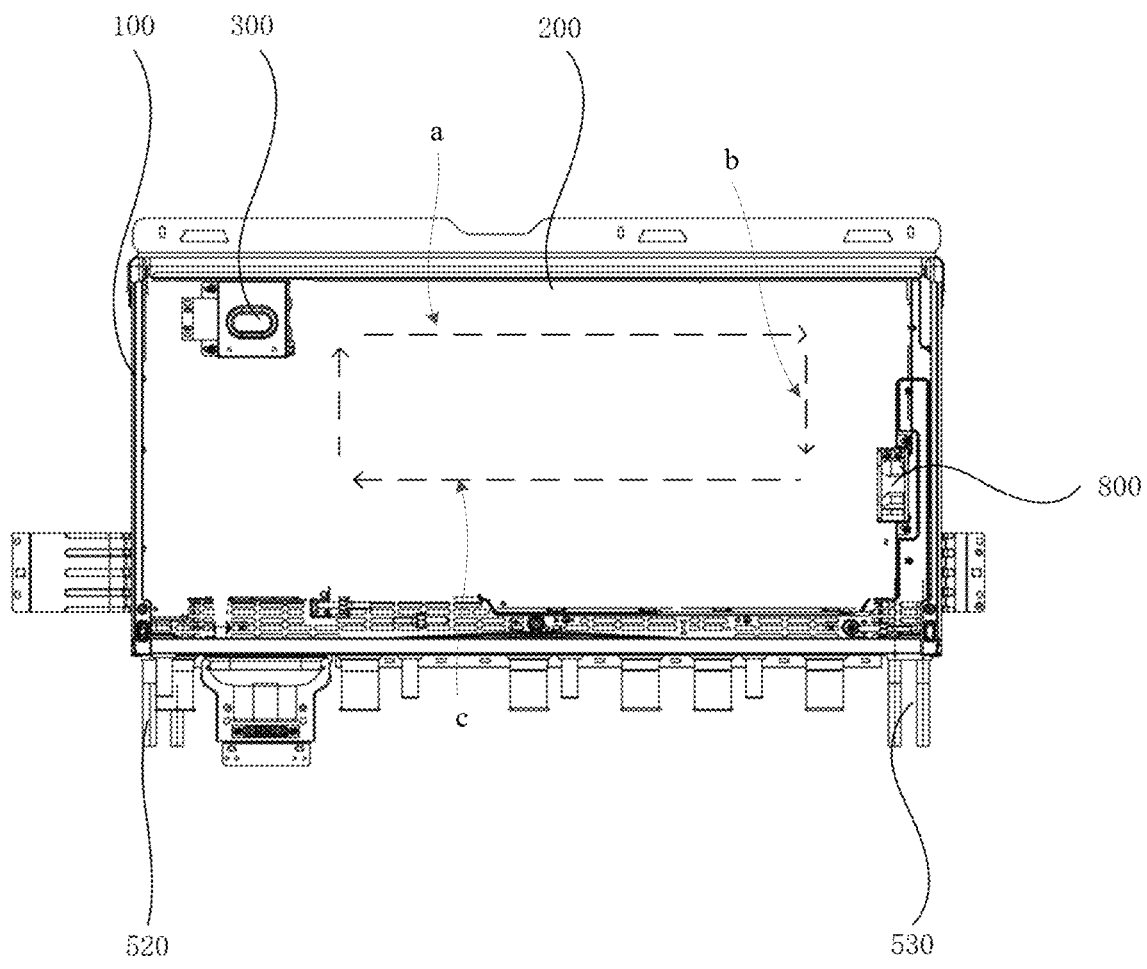
FIG. 3 is a schematic structural view 3 of an electric control box according to an embodiment of the present disclosure.

Schematically, the box body 100 is a rectangular-shaped box body, and may include a bottom plate 131, a box cover 140, a front side plate 1321, a rear side plate 1322, a left side plate 1323, and a right side plate 1324. With reference to FIG. 3, both the left side plate 1323 and the right side plate 1324 extend in a Y direction, and the left side plate 1323 is spaced apart from the right side plate 1324 in an X direction; and the rear side plate 1322 is located at a rear end of the left side plate 1323 and the right side plate 1324 to form a half-shell structure with an opening at a front end and a top end. In some embodiments, the rear side plate 1322, the left side plate 1323, and the right side plate 1324 and the bottom plate 131 may be integrally formed by using processes such as molding or stamping.

The front side plate 1321 may be fixed to the front side of the bottom plate 131 by bolts, buckles, etc. Both the front side plate 1321 and the rear side plate 1322 extend in the X direction, and the front side plate 1321 is spaced apart from the rear side plate 1322 in the Y direction.

The box cover 140 is opposite to the bottom plate 131. The box cover 140 may also be fixed to the top end of each of the front side plate 1321, the rear side plate 1322, the left side plate 1323, and the right side plate 1324 by the bolts, the buckles, etc.

It should be noted that the closed accommodation cavity 101 in the box body 100 can not only facilitate protection of the electrical device in the box body 100, and can also prevent external heat from affecting the heat dissipation of the electrical device. For example, during fitting, the bottom plate 131, the box cover 140, the front side plate 1321, the rear side plate 1322, the left side plate 1323, and the right side plate 1324 that are described above may be connected in a sealed manner through a sealant and a sealing ring to form a closed accommodation cavity 101 in the box body 100. The electric control box of the embodiments of the present disclosure may be, for example, a closed electric control box. In this way, damage to the electronic component in the electric control box caused by other foreign matters such as water drops and dust entering the electric control box can be avoided to achieve an effect of waterproof, dust prevention and anti-corrosion.

The shape of box body 100 is limited to the rectangular shape described above, and may also be other shapes. For example, the box body 100 may also be a cylindrical-shaped box body or a special-shaped box body, etc. In addition, when the electric control box is fitted in a housing of the air conditioner outdoor unit, any suitable surface can be selected to be fixed. For example, the rear side plate 1322 of the electric control box may be mounted to the housing of the outdoor unit, or the bottom plate 131 of the electric control box may also be fixed to the housing.

The heat dissipation assembly serves as a component for dissipating heat in the electric control box outside the electric control box and includes the heat exchanger 500 and a heat dissipation plate 540. The heat dissipation plate 540 has a first surface 541 and a second surface 542 opposite to the first surface 541. The at least one electric control module assembly 700 is mounted at the first surface 541, and the first surface 541 is in contact with the at least one electric control module assembly 700. The heat exchanger 500 is mounted at the second surface 542. The heat exchanger 500 may be welded to the heat dissipation plate. The heat exchanger 500 may be, but is not limited to, a microchannel heat exchanger. Therefore, heat of the electric control module assembly 700 may be transferred to the heat exchanger 500 through the heat dissipation plate 540.

For example, the heat dissipation plate 540 includes a body plate 543 and a boss 544 arranged at the body plate 543. The boss 544 is connected to the electric control module assembly 700. A surface of the body plate 543 facing away from the boss 544 is welded to the heat exchanger 500. By providing the boss 544, it is ensured that the heat dissipation plate 540 is in contact with the electric control module assembly 700 for heat dissipation.

The heat exchanger 500 of this embodiment includes a refrigerant entry pipe 520, a communication refrigerant output pipe 530, and a plurality of refrigerant heat exchange portions 510 arranged at intervals in the Y direction. The refrigerant heat exchange portion 510 is configured to circulate a heat exchange medium. The refrigerant heat exchange portion 510 may be a circular-shaped pipe, a square-shaped pipe, etc. The refrigerant heat exchange portion 510 of this embodiment may be a flat pipe, the flat pipe has a cross section that may be, but is not limited to, a rectangle, a circle, an ellipse, a trapezoid, etc. In this way, the refrigerant heat exchange portion 510 has a first surface and a second surface opposite to the first surface. Therefore, a large heat exchange area can be provided. Thus, the heat exchange efficiency is improved.

The refrigerant heat exchange portion 510 has a first end in communication with the refrigerant entry pipe 520 and a second end in communication with the refrigerant output pipe 530. Therefore, the heat exchange medium enters the refrigerant heat exchange portion 510 from the refrigerant entry pipe 520 and is then discharged through the refrigerant output pipe 530.

The refrigerant entry pipe 520 and the refrigerant output pipe 530 extend in a direction (corresponding to the Y direction in the figure) perpendicular to a length direction of the refrigerant heat exchange portion 510. Therefore, the refrigerant entry pipe 520 and the refrigerant output pipe 530 may be in communication with all the refrigerant heat exchange portions 510. For example, two refrigerant entry pipes 520 are provided, and two refrigerant output pipes 530 are provided. Therefore, a flow rate of the heat exchange medium can be improved. Thus, the heat dissipation effect can be improved. The number of the refrigerant entry pipes 520 and the number of the refrigerant output pipes 530 are not limited thereto.

The heat exchanger 500 in the embodiments of the present disclosure may be a microchannel heat exchanger. The microchannel heat exchanger includes at least two groups of microchannels. The at least two groups of microchannels include a plurality of first microchannels through which a first refrigerant flow flows and a plurality of second microchannels through which a second refrigerant flow flows. The second refrigerant flow absorbs heat from the first refrigerant flow to subcool the first refrigerant flow, or the first refrigerant flow absorbs heat from the second refrigerant flow to subcool the second refrigerant flow.

The microchannel heat exchanger in the embodiments of the present disclosure may also be configured as an economizer for an air conditioner. In this way, the microchannel heat exchanger may not only be configured to cool the electronic components in the electric control box, but also configured as the economizer. Therefore, a need for an additional economizer arranged outside the electric control box can be avoided. Thus, a structure of the air conditioner is simplified. As a result, the space is saved, and cost can also be saved.

According to the heat dissipation assembly of this embodiment, the heat exchanger 500 is provided to circulate the heat exchange medium, and the heat exchange medium exchanges heat with the air to reduce an air temperature in the box body 100. Moreover, the heat dissipation plate 540 is provided to be fixed and in contact with the electric control module assembly 700, and therefore the heat of the electric control module assembly 700 is conducted out to reduce the temperature of the electric control module assembly 700.

In addition, the second surface 542 of the heat dissipation plate 540 may be welded to the heat exchanger 500 to strengthen the heat exchanger 500, preventing the refrigerant heat exchange portion 510 from being bent out of shape or the plurality of refrigerant heat exchange portions 510 from overlapping together after displacement, and ensuring that the heat exchange medium in the refrigerant heat exchange portion 510 can smoothly flow and has a maximum heat exchange area. When the first fan 300 subsequently drives the air in the box body 100 to circulate, the air may pass through a spacing between the two adjacent refrigerant heat exchange portions 510 and is in full contact with a surface of the refrigerant heat exchange portion 510, in which the heat exchange medium circulates, for heat exchange. In this way, the heat exchange efficiency is improved. Therefore, the heat dissipation effect is improved.

In this embodiment, the heat exchanger 500 and the electric control module assembly 700 are mounted at two surfaces of the heat dissipation plate 540, respectively. The heat can be transferred to the heat exchanger 500 through the heat dissipation plate 540 and dissipated to the outer side of the box body 100 through the heat exchanger 500. Therefore, the heat in the electric control box is reduced.

The electric control module assembly 700 of this embodiment includes a plate body 730, a fan module 710, and a compressor module 720. A spacing is formed between the fan module 710 and the compressor module 720, and fan module 710 and the compressor module 720 are both arranged at the plate body 730. The fan module 710 is configured to control a fan of the air conditioner outdoor unit, and the compressor module 720 is configured to control a compressor of the air conditioner outdoor unit. Therefore, the fan module 710 and the compressor module 720 generate a large amount of heat. The electric control module assembly 700 may further include electrical components such as a capacitor and a resistor that are arranged at the plate body 730.

The fan module 710 and the compressor module 720 are both in contact with and connected to the first surface 541 of the heat dissipation plate 540. The fan module 710 is screwed and fixed to the heat dissipation plate 540, and the connection mode is simple and reliable. A thermally conductive adhesive layer is provided between the fan module 710 and the heat dissipation plate 540 to improve heat conduction efficiency. The compressor module 720 is screwed and fixed to the heat dissipation plate 540, and the connection mode is simple and reliable. A thermally conductive adhesive layer is provided between the compressor module 720 and the heat dissipation plate 540 to improve the heat conduction efficiency.

One heat dissipation plate 540 may be provided, and the fan module 710 and the compressor module 720 may be fixed to one heat dissipation plate 540 simultaneously. A plurality of heat dissipation plates 540 may be provided and arranged side by side at the heat exchanger 500. In this case, the fan module 710 and the compressor module 720 may be fixed to the same heat dissipation plate 540, or may be fixed to different heat dissipation plates 540, respectively.

The electric control box of this embodiment further includes a first fan 300 and a reactor 410. The first fan 300 is configured to drive air to flow, and the reactor 410 is configured for current limiting and filtering. Therefore, the air conditioner outdoor unit operates more stably. The first fan 300 and the reactor 410 are both mounted in the closed accommodation cavity 101. For example, the first fan 300 may be mounted at a side wall of the closed accommodation cavity 101, and may also be mounted at a mounting structure in the closed accommodation cavity 101.

The reactor 410 may be mounted at a side wall of the closed accommodation cavity 101, and the reactor 410 may also be mounted at a mounting structure in the closed accommodation cavity 101. A spacing is formed between the reactor 410 and the electric control module assembly 700, and the reactor 410 is opposite to the air outlet of the first fan 300. Therefore, heat generated by the reactor 410 can be carried away by the air under the action of the first fan 300. Thus, cooling is achieved.

The electric control box of this embodiment further includes a mounting plate 200 configured for a mounting of an electrical device, etc. The mounting plate 200 is fixed in the box body 100, for example, the mounting plate 200 is fixed in the box body 100 through threading and snapping. The mounting plate 200 has a first mounting surface and a second mounting surface opposite to the first mounting surface. The first mounting surface faces towards the bottom plate 131, and the second mounting surface faces towards the box cover 140. The mounting plate 200 may be a rectangular-shaped plate, which is arranged parallel to the bottom plate 131 and the box cover 140 of the box body 100. With reference to FIG. 3 and FIG. 7, the mounting plate 200 divides the closed accommodation cavity 101 into a first chamber 110 and a second chamber 120. The first mounting surface is located in the first chamber 110, and the second mounting surface is located in the second chamber 120.

The heat dissipation assembly is located in the first chamber 110 and configured to conduct the heat out of the box body 100. The first surface 541 of the heat dissipation plate 540 of the heat dissipation assembly is fixedly connected to the mounting plate 200. The heat dissipation plate 540 may be mounted at the first mounting surface through sapping, threading, etc. For example, the heat dissipation plate 540 is connected to the mounting plate 200 by screws, and the connection mode is stable and reliable. A thermally conductive adhesive layer may also be provided between the first surface 541 of the heat dissipation plate 540 and the first mounting surface to improve the heat transfer efficiency.

The reactor 410 is located in the second chamber 120 and fixedly connected to a side wall of the second chamber 120. For example, the reactor 410 may be mounted at a side plate of the box body 100 forming the second chamber 120, and may also be mounted at the mounting plate 200. The reactor 410 of this embodiment is mounted at the second mounting surface, and the reactor 410 may be mounted at the second mounting surface through snapping, screwing, etc.

When the heat dissipation plate 540 is mounted at the first mounting surface and the reactor 410 is mounted at the second mounting surface, heat generated by the reactor 410 may be transferred to the heat dissipation plate 540 through the mounting plate 200 and dissipated to the outer side of the box body 100 through the heat exchanger 500 to reduce heat in the electric control box.

In some embodiments, the reactor 410 is mounted at the mounting plate 200. In this case, the reactor 410 may perform air cooling under the action of the first fan 300.

In some other embodiments, the reactor 410 is mounted at the heat dissipation plate 540. In this case, the reactor 410 may perform air cooling under the action of the first fan 300, and heat of the reactor 410 is transferred to the heat exchanger 500 through the heat dissipation plate 540, and dissipated by exchanging heat with the heat exchange medium in the heat exchanger 500.

The above two heat dissipation modes are specifically described below. One is that a fan is provided to exchange air between the first chamber 110 and the second chamber 120 for air-cooling heat dissipation. The other is that a mounting opening 230 is formed at the mounting plate 200, and therefore the reactor 410 is in direct contact with the heat dissipation plate 540 for the heat dissipation, and the air-cooling heat dissipation and heat exchanger refrigerant heat dissipation are simultaneously performed.

In order to achieve airflow between the first chamber 110 and the second chamber 120, the mounting plate 200 is partially configured as an air inlet grille 201. For example, a front side of the mounting plate 200 is configured as the air inlet grille 201 extending in the X direction, and therefore the air in the second chamber 120 can easily enter the first chamber 110 at various positions in a long side direction (corresponding to the X direction in the figure) of the mounting plate 200 for heat dissipation. Thus, higher local heat caused by discharge obstruction of local air is avoided.

The first fan 300 can improve a flow speed of the air in the first chamber 110 and the second chamber 120. Under the action of the first fan 300, the air in the second chamber 120 is blown to the heat dissipation assembly in the first chamber 110 for heat exchange, and the air after the heat exchange is blown back to the second chamber 120, and therefore the flow and heat exchange of the air are realized inside the box body 100. In this way, cleanliness of the air inside the box body 100 is ensured.

A first predetermined spacing is formed between the first fan 300 and the air inlet grille 201, which is beneficial to prolonging a flow path of the air and improving the heat dissipation effect. The first fan 300 has an air inlet extending into the first chamber 110 and air outlet extending into the second chamber 120. Therefore, under the action of the first fan 300, air with a lower temperature in the first chamber 110 enters an inner side of the first fan 300 through the air inlet and then is discharged into the second chamber 120 through the air outlet. The air carries the heat in the second chamber 120 and returns to the first chamber 110 through the air inlet grille 201. After exchanging heat with the heat dissipation assembly, the temperature of the air decreases. This cycle is repeated to reduce the temperature of the electrical devices in the first chamber 110.

The air inlet of the first fan 300 extends into the first chamber 110 and is brought into communication with the first chamber 110. This is not limiting. For example, the mounting plate 200 has a through hole. The air inlet of the first fan 300 is directly opposite to the through hole and is brought into communication with the first chamber 110. The air outlet of the first fan 300 extends into the second chamber 120 and is brought into communication with the second chamber 120. When the first fan 300 may be mounted at the second mounting surface, the air outlet of the first fan 300 is located in the second chamber 120.

In this embodiment, electrical devices such as the first fan 300 and the reactor 410 are mounted at the second mounting surface of the mounting plate 200, and therefore transmission of signals and power supply are facilitated. For example, the first fan 300 includes a housing and a fan mounted in the housing, and the housing is fixed to the second mounting surface through screwing, snapping, etc. The housing has an air inlet and an air outlet. The air inlet is directly opposite to the through hole formed at the mounting plate 200 and is brought into communication with the first chamber 110. The air outlet is located in the second chamber 120.

In this embodiment, an air duct is formed between the air outlet of the first fan 300 and the air inlet grille 201, and the reactor 410 is mounted in the air duct. Therefore, the reactor 410 is located at a side of the air outlet of the first fan 300, and cold air blown out by the first fan 300 can be quickly in contact with the reactor 410 to carry away the heat generated by the reactor 410. In this way, the heat dissipation effect of the reactor 410 is improved.

In some possible embodiments, the air duct partition plate 150 is mounted to the mounting plate 200, and the air duct is defined and formed by the air duct partition plate 150, the mounting plate 200, and the box body 100. The air duct partition plate 150 may be fixed to the mounting plate 200 through snapping, bonding, screwing, etc.

The electronic control box of this embodiment may further include a mainboard 430, a power board 440, a filter 420, and an expansion board 600. Data signals of circuits and sensors are transmitted to the mainboard 430. The power board 440 is configured to distribute electrical energy to each electrical component. The filter 420 is configured to filter harmonics to ensure stability of the operation of the electrical device. The extension board 600 is configured to be connected to a device extended by a user. The electrical components in the electronic control box are not limited thereto.

The power board 440, the first fan 300, the filter 420, and the reactor 410 are arranged at intervals at a top end of the mounting plate 200 in the X direction to form a first group of electrical devices. The mainboard 430, the expansion board 600, and the electric control module assembly 700 are arranged at intervals at the mounting plate 200 in the X direction to form a second group of electrical devices. The first group of electrical devices, the second group of electrical devices, and the air inlet grille 201 are arranged side by side in the Y direction, and the air duct partition plate 150 is provided between the first group of electrical devices and the second group of electrical devices.

Through the above arrangement, the airflow exhausted from the air outlet of the first fan 300 enters the air inlet grille 201 sequentially through the filter 420 and the reactor 410 along the air duct, and the air located between the air duct partition plate 150 and the air inlet grille 201 is driven to flow and enter the first chamber 110 through the air inlet grille 201. With this arrangement, it is possible to prevent the reactor 410 that generates a large amount of heat from transferring heat to other electrical components and affecting them. Thus, the heat dissipation effect is improved.

In order to allow the airflow exhausted from the first fan 300 to flow to the air inlet grille 201, a spacing is formed between the electric control module assembly 700 and the right side plate 1324 of the box body 100, and therefore the air duck is generally L-shaped to prolong a flow distance of air and improve the heat dissipation effect. A flow speed of the air at a corner is affected. In order to improve the flow speed of the air in the air duct, the second fan 800 is further provided in the air duct. The second fan 800 is fixed to the second mounting surface of the mounting plate 200 to accelerate the air flow. For example, the second fan 800 is mounted between the electric control module assembly 700 and the right side plate 1324 of the box body 100 to improve the flow speed of the air. Thus, the heat dissipation effect is improved.

According to the embodiment of the present disclosure, the specific structure of the air duct partition plate 150 is not limited, and the air duct partition plate 150 may be provided based on a size of the electrical device, installation layout of the electrical device, etc.

According to the electric control box of this embodiment, the mounting plate 200 is provided to separate the heat dissipation assembly and the reactor 410 into the first chamber 110 and the second chamber 120, respectively; and the mounting plate 200 is partially configured as the air inlet grille 201, the first fan 300 is mounted at the mounting plate 200, the air inlet of the first fan 300 is in communication with the first chamber 110, and the air outlet of the first fan 300 is in communication with the second chamber 120. In this way, the first fan 300 can blow the air with a relatively low temperature in the first chamber 110 into the second chamber 120, and the air carries the heat generated by the reactor 410 and returns to the first chamber 110 through the air inlet grille 201 and exchanges the heat with the heat dissipation assembly to discharge the heat out of the electronic control box. This cycle is repeated to achieve the purpose of reducing the temperature in the electric control box. Moreover, the first fan 300 drives the air to flow, the heat generated by the reactor 410 and the heat generated by other electrical devices can be taken away, which facilitates improving heat dissipation efficiency.

The electric control module assembly 700 is away from the air outlet of the first fan 300, and when the air discharged from the air outlet of the first fan 300 flows to the electric control module assembly 700, the heat generated by the electrical devices such as the reactor 410 has been carried by the air. In order to improve the heat dissipation effect of the electric control module assembly 700, in conjunction with FIG. 1 and FIG. 3, in this embodiment, at least one mounting opening 230 is further provided at the mounting plate 200. The at least one mounting opening 230 is located between the air inlet grille 201 and the first fan 300. The at least one mounting opening 230 penetrates the mounting plate 200 in a thickness direction of the mounting plate 200 (in a Z direction in the figure). The at least one mounting opening 230 may be a circular-shaped opening, a polygonal-shaped opening, an irregular-shaped opening, etc., and the shape of the at least one mounting opening 230 is not limited in this embodiment.

In this case, the heat dissipation plate 540 is at least partially exposed at the mounting opening 230. The heat dissipation plate 540 may have a shape and size consistent with the shape and size of the mounting opening 230, that is, the heat dissipation plate 540 is completely exposed at the mounting opening 230. In this embodiment, a part of the structure of the heat dissipation plate 540 is exposed at the mounting opening 230, and another part of the structure of the heat dissipation plate 540 is attached to the first mounting surface and is fixedly connected to the first mounting surface by a screw.

The electric control module assembly 700 is fixedly connected to the heat dissipation plate 540 exposed at the mounting opening 230. That is, the electric control module assembly 700 is in direct contact with the heat dissipation plate 540, and the heat generated by the electric control module assembly 700 is directly transmitted to the heat exchanger 500 through the heat dissipation plate 540 for heat exchange. Therefore, the heat dissipation efficiency is high. For example, the electric control module assembly 700 is fixedly connected to the heat dissipation plate 540 by a screw, and a thermally conductive adhesive layer is provided between the electric control module assembly 700 and the heat dissipation plate 540. In this way, the heat transfer efficiency is improved.

A plurality of electric control module assemblies 700 in this embodiment is provided and arranged at intervals in the length direction (corresponding to the X direction in the figure) of the mounting plate 200. For example, two electric control module assemblies 700 are arranged at intervals in a length direction (corresponding to the X direction in the figure) of the mounting plate 200.

The plurality of electronic control module assemblies 700 shares one mounting opening 230. One heat dissipation plate 540 may be provided in the mounting opening 230. That is, all electric control module assemblies 700 are fixed to the same heat dissipation plate 540. In this case, a spacing is formed between two adjacent electric control module assemblies 700, and therefore a part of the heat dissipation plate 540 is exposed at the mounting opening 230. In this way, the airflow can flow through the heat dissipation plate 540, which facilitates improving the heat dissipation efficiency.

Figure 2:
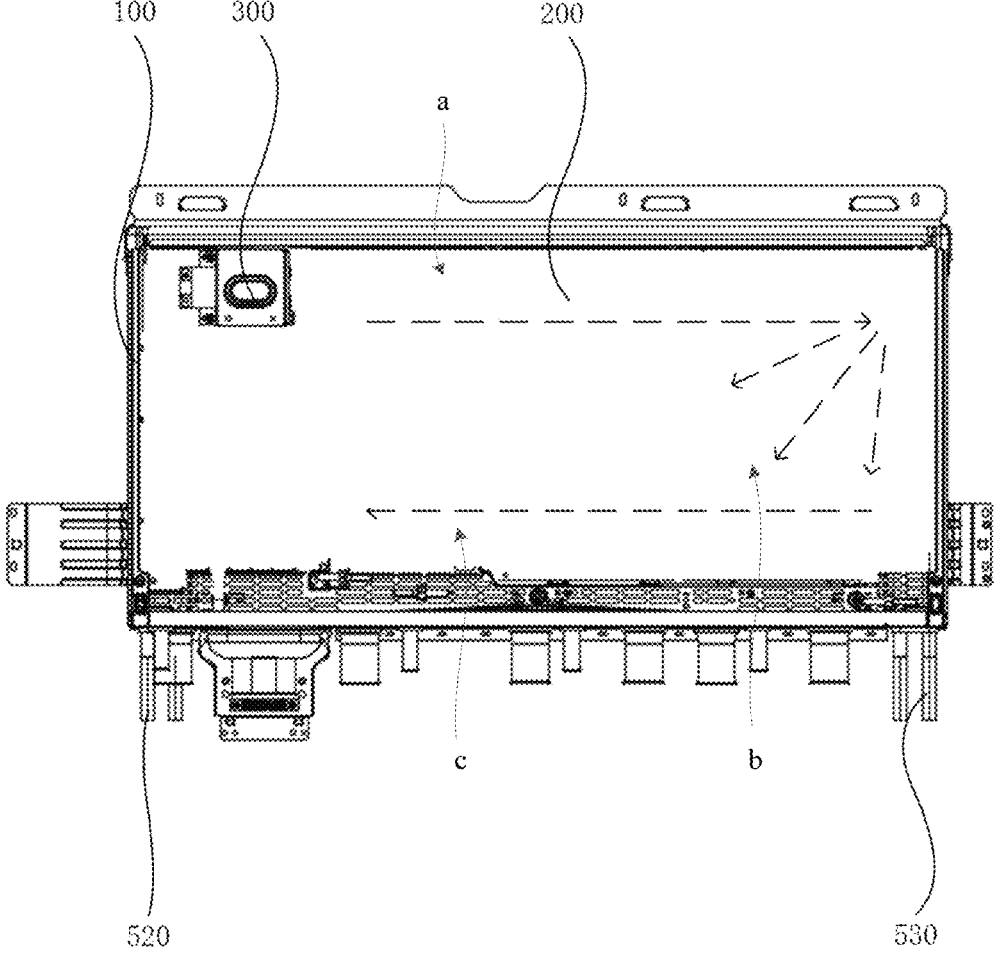
FIG. 2 is a schematic structural view 2 of an electric control box according to an embodiment of the present disclosure.

Each of the plurality of electronic control module assemblies 700 corresponds to one mounting opening 230, and in conjunction with FIG. 1 and FIG. 2, the mounting plate 200 has two mounting openings 230, each of the two electric control module assemblies 700 corresponds to one of the two mounting openings 230. One heat dissipation plate 540 may be provided and partially exposed at the two mounting openings 230. Two heat dissipation plates 540 may be provided, and each of the two heat dissipation plates 540 corresponds to one of the two mounting openings 230.

With reference to FIG. 1 to FIG. 3, the mounting plate 200 has two mounting openings 230 arranged side by side in the X direction, the heat dissipation assembly is provided with a heat dissipation plate 540, and a structure of the heat dissipation plate 540 are partially exposed at the two mounting openings 230. Two electronic control module assemblies 700 are provided, the electric control module assembly 700 at a left side is fixedly connected to the heat dissipation plate 540 exposed at the mounting opening 230 at a left side, and the electric control module assembly 700 at a right side is fixedly connected to the heat dissipation plate 540 exposed at the mounting opening 230 at a right side. In this way, the heat dissipation plate 540 can be easily fixedly connected to the mounting plate 200, and a part of the mounting plate 200 between the two mounting openings 230 can also provide a space for wiring.

In some possible embodiments, the reactor 410 relies on the airflow for the heat dissipation, and the reactor 410 is separated from the heat dissipation plate 540 by the mounting plate 200. Referring to FIG. 4 and FIG. 5, FIG. 5 is a schematic structural view of an electric control box according to Embodiment 2 of the present disclosure without an air duct partition plate and an electric control module assembly. The reactor 410 is screwed and fixed to the second mounting surface. In this case, the heat generated by the reactor 410 may be transmitted to the heat dissipation assembly through the mounting plate 200, or may also be transmitted to the heat dissipation assembly by the first fan 300 driving the air to flow.

In some other possible embodiments, the reactor 410 is in direct contact with the heat dissipation assembly to transfer heat for heat dissipation. In this case, the reactor 410 is fixedly connected to the heat dissipation plate 540 exposed at the mounting opening 230. For example, the reactor 410 is connected to the heat dissipation plate 540 by threading, snapping, etc., and therefore the reactor 410 is in contact with the heat dissipation plate 540 for heat conduction. In order to improve the heat transfer efficiency, a thermally conductive adhesive layer is further provided between the reactor 410 and the heat dissipation plate 540 of this embodiment.

The reactor 410 of this embodiment includes a reactor body 412 and a fixing plate 411 connected to the reactor body 412. A part of the fixing plate 411 is fixedly connected to the mounting plate 200, and another part of the fixing plate 411 is fixedly connected to the heat dissipation plate 540. The fixing plate 411 may be fixed to the mounting plate 200 through screwing, snapping, etc. The fixing plate 411 may be fixed to the heat dissipation plate 540 through the screwing, the snapping, etc. The reactor 410 of this embodiment is fixedly connected to the mounting plate 200 and the heat dissipation plate 540 at the same time, which facilitates improving stability and reliability of a mounting of the reactor 410.

When the reactor 410 is fixedly connected to the heat dissipation plate 540, the fixing plate 411 of the reactor 410 covers a part of the mounting opening 230 to allow the heat dissipation plate 540 in another part of the mounting opening 230 to be exposed at the first chamber 110. In this way, the air in the first chamber 110 can flow through the heat dissipation plate 540 to allow for contact heat exchange, which facilitates improving the heat dissipation effect.

The reactor 410 and the electric control module assembly 700 share one mounting opening 230. In this way, a mounting opening 230 is processed at the mounting plate 200 with no need to process a plurality of mounting openings 230, which facilitates improving convenience of processing.

The reactor 410 and the electric control module assembly 700 each correspond to one mounting opening 230. In this case, a plurality of mounting openings 230 is provided. The reactor 410 and the electric control module assembly 700 each correspond to one mounting opening 230, which can avoid mutual influence of the heat generated by the reactor 410 and the heat generated by the electric control module assembly 700.

A plurality of reactors 410 may be provided in this embodiment. The plurality of reactors 410 is mounted in the air duct side by side in an airflow direction and arranged side by side in the X direction at the outlet side of the first fan 300. In this embodiment, two reactors 410 be provided, and the two reactors 410 is spaced apart from the first fan in the X direction.

The plurality of reactors 410 shares one of the at least one mounting opening 230. In this way, the number of openings processed at the mounting plate 200 can be reduced, which improves processing efficiency. Each of the plurality of reactors 410 corresponds to one of the at least one mounting opening 230, and therefore heat dissipation between the plurality of reactors 410 can be avoided.

For example, the mounting plate 200 has two mounting openings 230 that are spaced apart from each other in the X direction, one heat dissipation plate 540 is provided, a part of a structure of the heat dissipation plate 540 is exposed at the mounting opening 230 at a left side, and another part of the structure of the heat dissipation plate 540 is exposed at the mounting opening 230 at a right side. The electric control box is internally provided with two reactors 410 and two electric control module assemblies 700. A reactor 410 at the left side and an electric control module assembly 700 at the left side share the mounting opening 230 at the left side, and a reactor 410 at the right side and an electric control module assembly 700 at the right side share the mounting opening 230 at the right side.

Figure 17:
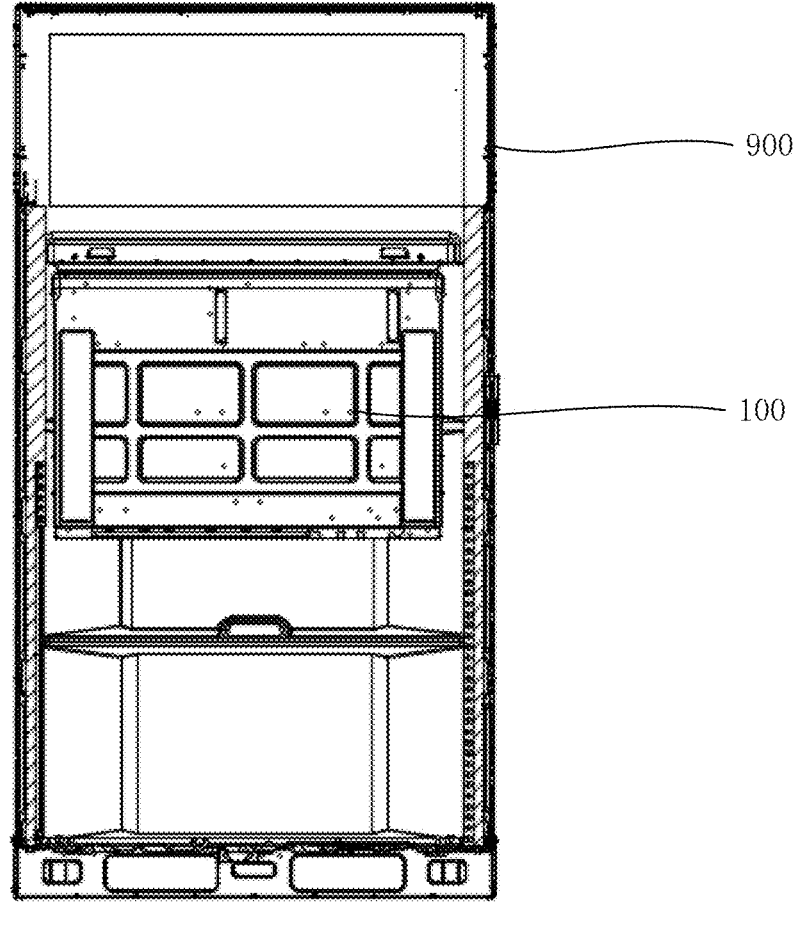
FIG. 17 is a schematic structural view of an air conditioner outdoor unit according to an embodiment of the present disclosure.

An air conditioner outdoor unit provided by the embodiments of the present disclosure includes the electric control box provided by the present disclosure and the casing 900. The electric control box is located inside the casing 900 as illustrated in FIG. 17.

The air conditioner outdoor unit provided in the embodiments of the present disclosure may be an outdoor unit of a central air conditioner. The electric control box is arranged inside a casing of the outdoor unit of the central air conditioner. The condenser in communication with the heat exchanger 500 in the electric control box may be a heat exchanger in the outdoor unit of the central air conditioner.

The outdoor unit of the central air conditioner is internally provided with two compressors and an outdoor fan. Each electric control module assembly in the electric control box is configured to be connected to and control a corresponding compressor. Each electric control module assembly in the electric control box is also configured to be connected to and control a corresponding outdoor fan.

Since the air conditioner outdoor unit of the embodiments of the present disclosure adopts the above-mentioned technical solutions of the electric control box, at least all the beneficial effects brought by the technical solutions of the electric control box are achieved, and details thereof are not repeated herein.

An air conditioner provided in the embodiments of the present disclosure includes the above-mentioned air conditioner outdoor unit provided in the embodiments of the present disclosure.

The air conditioner according to the embodiments of the present disclosure may be a central air conditioner. The central air conditioner includes an outdoor unit of the central air conditioner mounted outdoors and an indoor unit of the central air conditioner mounted indoors. The indoor unit of the central air conditioner and the outdoor unit of the central air conditioner cooperate with each other to achieve functions of refrigeration, heating, dehumidification, etc., of the air conditioner. In the central air conditioner, one outdoor unit of the central air conditioner is provided, and two or more indoor units of the central air conditioner are provided.

The indoor unit of the central air conditioner is usually provided with an indoor heat exchanger, and the outdoor unit of the central air conditioner is usually provided with an outdoor heat exchanger. The indoor heat exchanger is usually in communication with the outdoor heat exchanger via a refrigerant pipeline to allow a refrigerant between the indoor heat exchanger and the outdoor heat exchanger to circulate. In a refrigeration process of the central air conditioner, the indoor heat exchanger is an evaporator, and a refrigerant in the evaporator absorbs heat from liquid to be gaseous. In an evaporation and heat absorption process of the refrigerant, the evaporator exchanges heat with air flowing through the evaporator to take away heat in the air in the indoor unit of the central air conditioner, and therefore air exhausted out of the indoor unit of the central air conditioner is air after heat release and cooling. In this case, the indoor unit of the central air conditioner blows cold air. Meanwhile, the outdoor heat exchanger is a condenser, and a refrigerant in the condenser changes from a gaseous state to a liquid state. In a condensation and heat release process of the refrigerant, the condenser exchanges heat with air in the outdoor unit of the central air conditioner flowing through the condenser, and therefore the air in the outdoor unit of the central air conditioner takes away heat of the condenser to an outer side of the outdoor unit of the central air conditioner. In this way, the refrigeration process is realized.

In a heating process of the central air conditioner, the outdoor heat exchanger is an evaporator, and a refrigerant in the evaporator absorbs heat and changes from a liquid state to a gaseous state. In an evaporation and heat absorption process of the refrigerant, the evaporator exchanges heat with the air flowing through the evaporator, and heat carried in the air in the outdoor unit of the central air conditioner is exchanged into the refrigerant in the evaporator. Meanwhile, the indoor heat exchanger is a condenser, and a refrigerant in the condenser changes from a gaseous state to a liquid state. In a condensation and heat release process of the refrigerant, the condenser exchanges heat with air in the indoor unit of the central air conditioner flowing through the condenser, and therefore the air in the indoor unit of the central air conditioner takes away heat carried by the condenser and is exhausted into a room outside the indoor unit of the central air conditioner from the indoor unit of the central air conditioner. In this case, the indoor unit of the central air conditioner blows hot air. In this way, the heating process is realized.

The electric control box is mounted in an outdoor unit of the central air conditioner. For example, the electric control box may be configured to control an operating process of a compressor in the outdoor unit of the central air conditioner, and the heat exchanger 500 in the electric control box may be in communication with the outdoor heat exchanger.

Since the air conditioner of the embodiments of the present disclosure adopts the above-mentioned technical solutions of the electronic control box, at least all the beneficial effects brought by the above-mentioned technical solutions of the electronic control box are achieved, and details thereof are not repeated herein.

In the description of the present disclosure, it is to be understood that, terms such as "center," "longitudinal," "lateral," "length," "width," "thickness," "over," "below," "front," "back," "left," "right," "vertical," "horizontal," "top," "bottom," "in," "out," "clockwise," "anti-clockwise," "axial," "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance or implicitly indicate the quantity of technical features indicated. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first feature being "on" or "under" the second feature can refer to the first feature and the second feature being in direct contact or being in indirect contact via a media. Further, the first feature being "on," "above," "over" the second feature may refer to the first feature being right over the second feature or being obliquely above the second feature, or just refer to the horizontal height of the first feature being higher than the horizontal height of the second feature. The first feature is "below" or "under" the second feature may refer to the first feature being right over the second feature or being obliquely under the second feature, or just refer to the horizontal height of the first feature being lower than the horizontal height of the second feature.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. An electric control box comprising:

a box body; and a mounting plate arranged in the box body, the mounting plate being provided with a fan and a plurality of electronic components at a mounting side of the mounting plate;

wherein:

the fan is configured to form first heat dissipation airflow flowing along a first heat dissipation path;

the first heat dissipation airflow is diverted by an inner wall of the box body to form second heat dissipation airflow flowing along a second heat dissipation path;

the first heat dissipation path and the second heat dissipation path are located at the mounting side of the mounting plate;

the plurality of electronic components are distributed over the first heat dissipation path and the second heat dissipation path;

the mounting plate divides a space in the box body into:

a first chamber accommodating the plurality of electronic components; and a second chamber configured to accommodate a heat exchanger; and the mounting plate has a first air return inlet and a second air return inlet that penetrate the mounting plate, the first air return inlet being located at a head end of the first heat dissipation path, and the second air return inlet being located at a tail end of the second heat dissipation path.

2. The electric control box according to claim 1, wherein the first heat dissipation path and the second heat dissipation path are connected end to end to form a circulation heat dissipation path.

3. The electric control box according to claim 1, wherein the fan has an inlet in communication with the first air return inlet and an outlet facing towards the head end of the first heat dissipation path.

4. The electric control box according to claim 1, wherein:

the mounting plate is a rectangular-shaped plate;

the first air return inlet is located at a first corner of the rectangular-shaped plate;

the second air return inlet is located at a second corner of the rectangular-shaped plate; and the second corner and the first corner are located at two ends of a same diagonal of the rectangular-shaped plate, respectively.

5. The electric control box according to claim 1, wherein:

the first air return inlet is arranged at a first side of the mounting plate; and the second air return inlet is one of a plurality of second air return inlets provided and arranged at intervals along a second side of the mounting plate, the first side being opposite to the second side.

6. The electric control box according to claim 1, further comprising:

an air duct partition plate arranged in the box body and mounted at the mounting plate;

wherein:

a cooling air duct is formed by the air duct partition plate, the mounting plate, and the box body;

at least some of the plurality of electronic components are located in the cooling air duct; and the fan is configured to drive air to flow in the cooling air duct to form the first heat dissipation airflow.

7. The electric control box according to claim 6, wherein:

the air duct partition plate includes a main plate body and a secondary plate body connected to each other, the main plate body being arranged relative to the secondary plate body at an angle; and the cooling air duct includes:

a first air duct formed by the main plate body, the mounting plate, and the box body; and a second air duct formed by the secondary plate body, the mounting plate, and the box body.

8. The electric control box according to claim 7, wherein the air duct partition plate has at least one recess configured to avoid one of the plurality of electronic components that faces towards the recess.

9. The electric control box according to claim 8, wherein:

the main plate body is bent to form the recess; and the main plate body at least includes a first plate body, a second plate body, and a third plate body that are connected to each other sequentially, the first plate body being opposite to the third plate body, the recess being formed by the first plate body, the second plate body, and the third plate body, and an opening of the recess facing towards an inner side of the cooling air duct.

10. The electric control box according to claim 1, wherein the fan is a first fan;

the electric control box further comprising:

a second fan arranged on the first heat dissipation path or the second heat dissipation path.

11. The electric control box according to claim 10, wherein the second fan is arranged at a head end of the second heat dissipation path.

12. The electric control box according to claim 10, wherein:

the second fan is arranged at a tail end of the second heat dissipation path;

the first fan has an air outlet direction that does not intersect an air outlet direction of the second fan; and the second fan is configured to form third heat dissipation airflow flowing along a third heat dissipation path.

13. The electric control box according to claim 1, further comprising:

an electric control module assembly arranged in a closed accommodation cavity of the box body; and a heat dissipation plate having a first surface and a second surface opposite to the first surface;

wherein:

the electric control module assembly is mounted at the first surface and in contact with the first surface; and the second surface is configured to receive a heat exchanger.

14. The electric control box according to claim 13, wherein the electric control module assembly includes a plate body, a fan module, and a compressor module, the fan module and the compressor module being both arranged at the plate body, and the fan module and the compressor module being both mounted at the first surface and in contact with the first surface.

15. The electric control box according to claim 14, wherein the plurality of electronic components include a filter and a reactor, the filter and the reactor being distributed on the first heat dissipation path.

16. The electric control box according to claim 15, wherein the filter is located upstream of the reactor.

17. The electric control box according to claim 16, wherein:
the reactor is mounted at the heat dissipation plate; and/or
the reactor is mounted at the mounting plate.

18. The electric control box according to claim 17, wherein:
a part of the mounting plate is configured as an air inlet grille;
the mounting plate divides a space in the box body into:
a first chamber accommodating the heat exchanger and the heat dissipation plate; and
a second chamber accommodating the fan and the reactor; and
airflow formed by the fan circulates around the first chamber and the second chamber.

19. An electric control box comprising:
a box body;
a mounting plate arranged in the box body, the mounting plate being provided with a fan and a plurality of electronic components at a mounting side of the mounting plate; and
an air duct partition plate arranged in the box body and mounted at the mounting plate;
wherein:
the fan is configured to form first heat dissipation airflow flowing along a first heat dissipation path;
the first heat dissipation airflow is diverted by an inner wall of the box body to form second heat dissipation airflow flowing along a second heat dissipation path;
the first heat dissipation path and the second heat dissipation path are located at the mounting side of the mounting plate;
the plurality of electronic components are distributed over the first heat dissipation path and the second heat dissipation path;
a cooling air duct is formed by the air duct partition plate, the mounting plate, and the box body;
at least some of the plurality of electronic components are located in the cooling air duct;
the fan is configured to drive air to flow in the cooling air duct to form the first heat dissipation airflow;

the air duct partition plate includes a main plate body and a secondary plate body connected to each other, the main plate body being arranged relative to the secondary plate body at an angle;
the cooling air duct includes:
a first air duct formed by the main plate body, the mounting plate, and the box body; and
a second air duct formed by the secondary plate body, the mounting plate, and the box body; and
the air duct partition plate has at least one recess configured to avoid one of the plurality of electronic components that faces towards the recess.

20. An electric control box comprising:
a box body;
a mounting plate arranged in the box body, the mounting plate being provided with a fan and a plurality of electronic components at a mounting side of the mounting plate;
an electric control module assembly arranged in a closed accommodation cavity of the box body; and
a heat dissipation plate having a first surface and a second surface opposite to the first surface;
wherein:
the fan is configured to form first heat dissipation airflow flowing along a first heat dissipation path;
the first heat dissipation airflow is diverted by an inner wall of the box body to form second heat dissipation airflow flowing along a second heat dissipation path;
the first heat dissipation path and the second heat dissipation path are located at the mounting side of the mounting plate;
the plurality of electronic components are distributed over the first heat dissipation path and the second heat dissipation path;
the electric control module assembly is mounted at the first surface and in contact with the first surface;
the second surface is configured to receive a heat exchanger; and
the electric control module assembly includes a plate body, a fan module, and a compressor module, the fan module and the compressor module being both arranged at the plate body, and the fan module and the compressor module being both mounted at the first surface and in contact with the first surface.

* * * * *